(12) United States Patent
Choe et al.

(10) Patent No.: US 11,957,005 B2
(45) Date of Patent: Apr. 9, 2024

(54) DISPLAY DEVICE

(71) Applicant: Samsung Display Co., Ltd., Yongin-si (KR)

(72) Inventors: Seo Won Choe, Seongnam-si (KR); Ki Wook Kim, Hwaseong-si (KR); Yang Wan Kim, Hwaseong-si (KR); Hyun Woong Kim, Gwangmyeong-si (KR); Eun Byul Jo, Daegu (KR)

(73) Assignee: Samsung Display Co., Ltd., Yongin-si (KR)

( * ) Notice: Subject to any disclaimer, the term of this patent is extended or adjusted under 35 U.S.C. 154(b) by 301 days.

(21) Appl. No.: 16/937,412

(22) Filed: Jul. 23, 2020

(65) Prior Publication Data

US 2021/0151542 A1  May 20, 2021

(30) Foreign Application Priority Data

Nov. 19, 2019 (KR) .................. 10-2019-0148335

(51) Int. Cl.
*G09G 3/32* (2016.01)
*G09G 3/3266* (2016.01)
*H10K 59/121* (2023.01)
*H10K 59/126* (2023.01)
*H10K 59/131* (2023.01)
*H10K 59/40* (2023.01)
*G06F 3/044* (2006.01)

(52) U.S. Cl.
CPC ......... *H10K 59/131* (2023.02); *G09G 3/3266* (2013.01); *H10K 59/1216* (2023.02); *H10K 59/126* (2023.02); *H10K 59/40* (2023.02); *G06F 3/0446* (2019.05)

(58) Field of Classification Search
CPC .............. H01L 27/3276; H01L 27/323; H01L 27/3265; H01L 27/3272; G09G 3/3266; G09G 3/3233; G09G 2300/0814; G09G 3/32; H10K 59/131; H10K 59/1216; H10K 59/126; H10K 59/40
See application file for complete search history.

(56) References Cited

U.S. PATENT DOCUMENTS

| | | | |
|---|---|---|---|
| 2017/0132965 A1* | 5/2017 | Hsu | H01L 27/3276 |
| 2018/0254304 A1* | 9/2018 | Hong | H01L 27/3258 |
| 2019/0073962 A1* | 3/2019 | Aflatooni | G09G 3/3275 |

(Continued)

FOREIGN PATENT DOCUMENTS

| | | |
|---|---|---|
| KR | 10-2018-0050372 A | 5/2018 |
| KR | 10-2018-0128555 A | 12/2018 |
| KR | 10-2019-0027717 A | 3/2019 |

*Primary Examiner* — S M Sohel Imtiaz
(74) *Attorney, Agent, or Firm* — Lewis Roca Rothgerber Christie LLP

(57) ABSTRACT

A display device includes: a substrate; scan lines extending in a first direction, and arranged along a second direction crossing the first direction on the substrate; data lines extending in the second direction, and arranged along the first direction on the substrate; a display area including pixels connected to the scan lines and the data lines; and a non-display area around the display area, and including compensation capacitors connected to some scan lines from among the scan lines. A sum of a capacitance of q odd scan lines or q even scan lines that are adjacent to each other from among the scan lines increases in the second direction, where q is a positive integer.

20 Claims, 20 Drawing Sheets

(56) References Cited

U.S. PATENT DOCUMENTS

| | | | | |
|---|---|---|---|---|
| 2019/0131370 A1* | 5/2019 | Heo | .................... | H01L 27/1259 |
| 2019/0165004 A1* | 5/2019 | Lou | ................... | H01L 29/78696 |
| 2019/0165076 A1* | 5/2019 | Lee | ..................... | H01L 51/5253 |
| 2020/0058242 A1* | 2/2020 | Liu | ....................... | H01L 27/124 |
| 2020/0335043 A1* | 10/2020 | Zhao | ................... | G09G 3/3225 |

* cited by examiner

FIG. 3
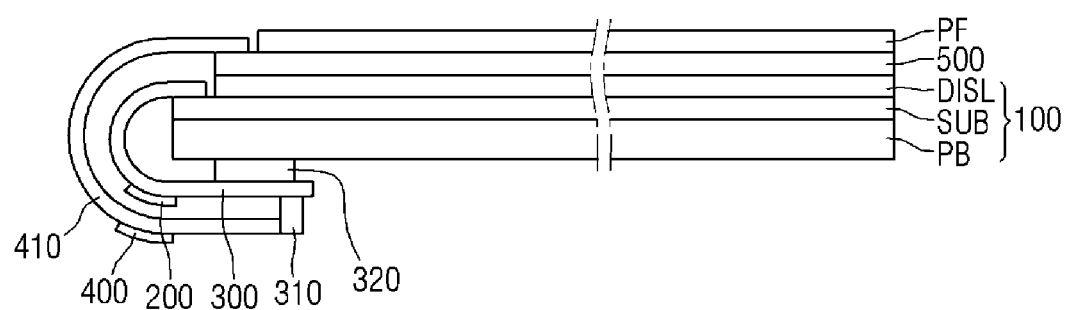
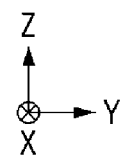

DISPLAY DEVICE

CROSS-REFERENCE TO RELATED APPLICATION

This application claims priority to and the benefit of Korean Patent Application No. 10-2019-0148335, filed on Nov. 19, 2019, in the Korean Intellectual Property Office, the entire content of which is incorporated by reference herein.

BACKGROUND

1. Field

Aspects of one or more example embodiments of the present disclosure relate to a display device.

2. Description of the Related Art

With the development of information society, requirements for display devices for displaying images have increased in various forms. For example, display devices are applied to various electronic appliances, such as smart phones, digital cameras, notebook computers, navigators, smart televisions, and the like. A display device may be a flat panel display device, for example, such as a liquid crystal display device, a field emission display device, a light emitting display device, and/or the like.

The display device may include a display panel having a display area for displaying an image, a non-display area for not displaying an image, and an optical sensor that senses light, for example, such as a camera sensor, an illuminance sensor, an infrared sensor, and/or the like. Scan lines to which scan signals are applied, data lines to which data voltages are applied, and pixels connected to the scan lines and the data lines may be formed at (e.g., in or on) the display area of the display panel. In this case, the display area of the display panel may be formed so as to not overlap with the optical sensor, and thus, the display area of the display panel may be formed to have a notch shape in which a part of the display panel is recessed concavely when viewed on a plane (e.g., in a plan view). In this case, the number of pixels connected to each scan line may be different, and a parasitic capacitance may be different for each scan line. In other words, because resistive-capacitive (RC) delay is different for each scan line, a difference in a pulse width of a scan signal due to the RC delay may occur for each scan line.

The above information disclosed in this Background section is for enhancement of understanding of the background of the present disclosure, and therefore, it may contain information that does not constitute prior art.

SUMMARY

One or more example embodiments of the present disclosure are directed to a display device capable of reducing or minimizing a difference in a pulse width of a scan signal due to RC delay for each scan line.

However, aspects and features of the present disclosure are not limited thereto. Accordingly, the above and other aspects and features of the present disclosure will become more apparent to one of ordinary skill in the art to which the present disclosure pertains with reference to the figures and the detailed description of the present disclosure.

According to one or more example embodiments of the present disclosure, a display device includes: a substrate; scan lines extending in a first direction, and arranged along a second direction crossing the first direction on the substrate; data lines extending in the second direction, and arranged along the first direction on the substrate; a display area including pixels connected to the scan lines and the data lines; and a non-display area around the display area, and including compensation capacitors connected to some scan lines from among the scan lines. A sum of a capacitance of q odd scan lines or q even scan lines that are adjacent to each other from among the scan lines increases in the second direction, where q is a positive integer.

In an example embodiment, the sum of the capacitance of the q odd scan lines or the q even scan lines may be defined as a sum of a capacitance of a pth scan line, a capacitance of a (p+2)th scan line, and capacitance of a (p+4)th scan line, where p is a positive integer.

In an example embodiment, the sum of the capacitance of the q odd scan lines or the q even scan lines may increase as the p increases.

In an example embodiment, the sum of the capacitance of the pth scan line, the capacitance of the (p+2)th scan line, and the capacitance of the (p+4)th scan line may be less than a sum of a capacitance of the (p+2)th scan line, the capacitance of the (p+4)th scan line, and a capacitance of a p+6th scan line.

In an example embodiment, a number of the compensation capacitors connected to the pth scan line may be greater than a number of the compensation capacitors connected to a (p+1)th scan line.

In an example embodiment, the number of the compensation capacitors connected to the (p+1)th scan line may be less than a number of the compensation capacitors connected to the (p+2)th scan line.

In an example embodiment, each of the compensation capacitors may include: a first electrode connected to one of the scan lines; and a second electrode overlapping with the first electrode, and electrically connected to a first driving voltage line to which a first driving voltage is applied.

In an example embodiment, each of the pixels may include a driving transistor including an active layer on a buffer film, and a first electrode, a second electrode, and a gate electrode on the active layer, and the first electrode of the compensation capacitor may be on the buffer film.

In an example embodiment, the second electrode of the compensation capacitor may be on a first insulating film on the gate electrode.

In an example embodiment, the first driving voltage line may be on a second insulating film on the second electrode of the compensation capacitor.

In an example embodiment, the display device may further include: a sub-driving voltage line on the buffer film, and connected to the first electrode of the compensation capacitor, and the first driving voltage line may be connected to the sub-driving voltage line through a connection contact hole penetrating the first insulating film and the second insulating film.

In an example embodiment, the display area may include: a first display area; a second display area protruding from a first side of the first display area in the second direction; and a third display area protruding from the first side of the first display area in the second direction, the third display area being spaced from the second display area in the first direction. The non-display area may include a notch non-display area at a notch area between the second display area and the third display area in the first direction, and the compensation capacitors may be located at the notch non-display area.

In an example embodiment, scan lines of the second display area may be electrically separated from scan lines of the third display area.

In an example embodiment, the display device may further include: a first scan driver adjacent to the second display area and connected to the scan lines of the second display area; and a second scan driver adjacent to the third display area and connected to the scan lines of the third display area.

According to one or more example embodiments of the present disclosure, a display device includes: a display area including scan lines extending in a first direction, data lines extending in a second direction crossing the first direction, and pixels connected to the scan lines and the data lines; and a non-display area around the display area, and including compensation capacitors connected to some of the scan lines. A number of the compensation capacitors connected to a pth scan line from among the scan lines is greater than a number of the compensation capacitors overlapping with a (p+1)th scan line from among the scan lines, where p is a positive integer.

In an example embodiment, the number of the compensation capacitors connected to the (p+1)th scan line may be less than a number of the compensation capacitors connected to a (p+2)th scan line.

In an example embodiment, a capacitance of q odd scan lines or q even scan lines that are adjacent to each other from among the scan lines may increase in the second direction, where q is a positive integer, and the capacitance of the q odd scan lines or the q even scan lines may be defined as a sum of a capacitance of the pth scan line, a capacitance of a (p+2)th scan line, and a capacitance of a (p+4)th scan line.

According to one or more example embodiments of the present disclosure, a display device includes: a substrate; an active layer of a driving transistor and a first electrode of a compensation capacitor, the active layer and first electrode being arranged on the substrate; a gate insulating film on the active layer of the driving transistor; a gate electrode of the driving transistor on the gate insulating film, and overlapping with the active layer of the driving transistor in a thickness direction of the substrate; a first insulating film on the gate electrode; and a second electrode of the compensation capacitor on the first insulating film, and overlapping with the first electrode of the compensation capacitor in the thickness direction of the substrate.

In an example embodiment, the display device may further include: a second insulating film on the second electrode of the compensation capacitor; and a first driving voltage line on the second insulating film, the first driving voltage line configured to receive a first driving voltage.

In an example embodiment, the first driving voltage line may be connected to the first electrode of the compensation capacitor through a connection contact hole penetrating the first insulating film and the second insulating film.

BRIEF DESCRIPTION OF THE DRAWINGS

The above and other aspects and features of the present disclosure will become more apparent to those skilled in the art from the following detailed description of the example embodiments with reference to the accompanying drawings, in which:

FIG. 3 is a side view of a display device according to an embodiment;

DETAILED DESCRIPTION

Figure 1:
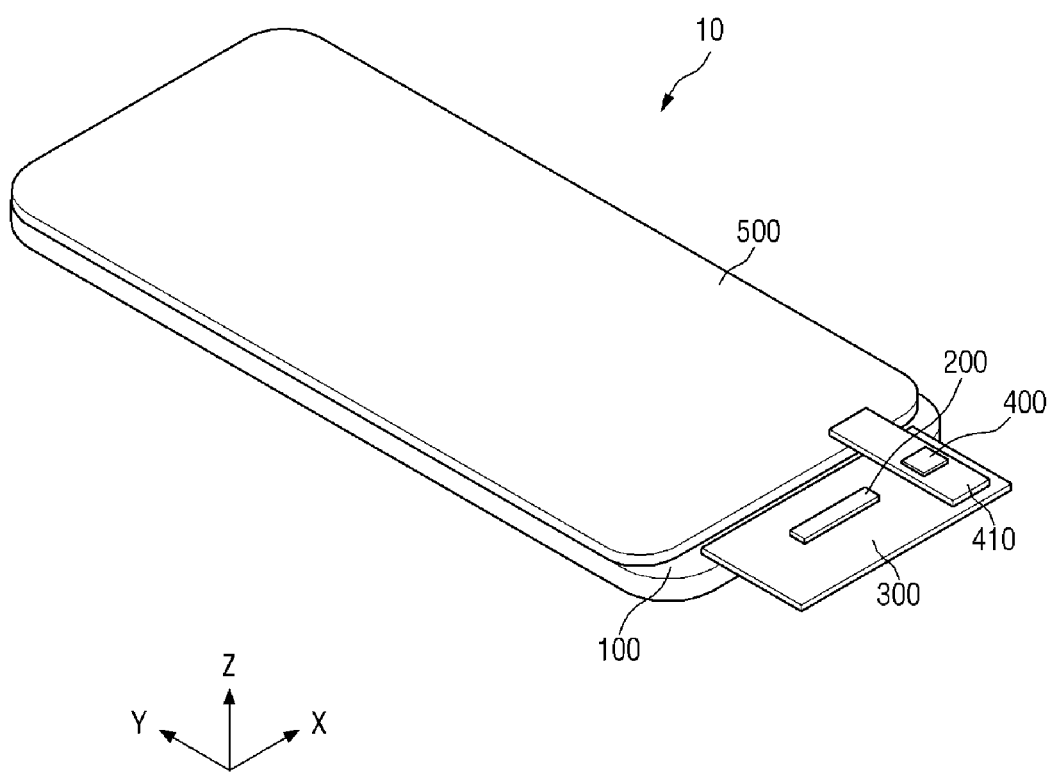
FIG. 1 is a perspective view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
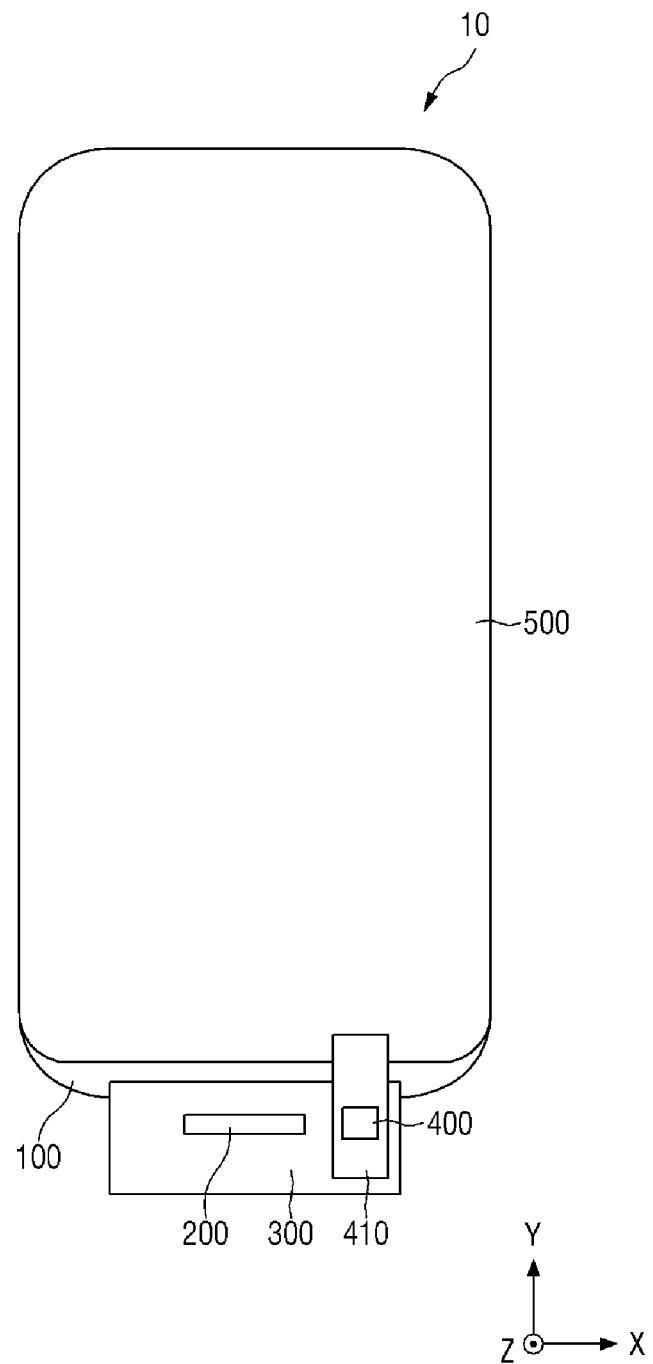
FIG. 2 is a plan view of a display device according to an embodiment.

FIG. 1 is a perspective view of a display device according to an embodiment, FIG. 2 is a plan view of a display device according to an embodiment, and FIG. 3 is a side view of a display device according to an embodiment.

As used in this specification, a first direction (e.g., an X-axis direction) may be a direction that is parallel to or substantially parallel to a short side of a display device 10 in a plan view, for example, a horizontal direction of the display device 10. A second direction (e.g., a Y-axis direction) may be a direction that is parallel to or substantially parallel to a long side of the display device 10 in the plan view, for example, a vertical direction of the display device 10. A third direction (e.g., a Z-axis direction) may be a thickness direction of a display panel 100 of the display device 10.

Referring to FIGS. 1 to 3, the display device 10 may be a device for displaying a moving image and/or a still image. The display device 10 may be used as a display screen for various suitable electronic devices and products, for example, such as televisions, notebooks, monitors, billboards, internet of things (IOT) devices, and/or the like, as well as for various suitable portable electronic appliances, for example, such as mobile phones, smart phones, tablet personal computers (e.g., tablet PCs), smart watches, watch phones, mobile communication terminals, electronic notebooks, electronic books, portable multimedia players (PMPs), navigators, ultra-mobile PCs (UMPCs), and/or the like.

The display device 10 may be a light emitting display device, for example, such as an organic light emitting display device that uses an organic light emitting diode, a quantum dot light emitting display device including a quantum dot light emitting layer, an inorganic light emitting display device including an inorganic semiconductor, a micro light emitting display device that uses a micro light emitting diode (LED), and/or the like. Hereinafter, for convenience, the display device 10 may be mainly described in the context of an organic light emitting display device, but the present invention is not limited thereto.

The display device 10 includes the display panel 100, a display driver 200, a display circuit board 300, a touch driver 400, a touch circuit board 410, and a touch panel 500.

The display panel 100 may have a rectangular planar shape (e.g., a rectangular shape in a plan view) having short sides extending in the first direction (e.g., the X-axis direction), and long sides extending in the second direction (e.g., the Y-axis direction). A corner where the short side extending in the first direction (e.g., the X-axis direction) meets the long side extending in the second direction (e.g., the Y-axis direction) may be formed to have a rounded shape or a right angle shape. However, the planar shape of the display panel 100 is not limited to the rectangular shape, and the display panel 100 may be formed to have any suitable shape, for example, such as another polygonal shape, a circular shape, an elliptical shape, and/or the like.

The display panel 100 may be formed to be flat, but the present invention is not limited thereto. For example, the display panel 100 may include a curved portion formed at left and right ends (e.g., left and right sides in a plan view) thereof, and the curved portion may have a constant curvature or a variable curvature. In an embodiment, the display panel 100 may be flexible, such that the display panel 100 may be bent, warped, folded, and/or rolled.

The display panel 100 may include a substrate SUB, a display layer DISL, and a panel lower cover PB.

The substrate SUB may include (e.g., may be made of) an insulating material, for example, such as glass, quartz, or polymer resin. The substrate SUB may be a rigid substrate, or a flexible substrate capable of being bent, folded, rolled, and/or the like.

The display layer DISL may be disposed on the substrate SUB. The display layer DISL may be a layer including pixels, and may be configured for displaying an image. The display layer DISL may include a thin film transistor layer in which thin film transistors are formed, a light emitting element layer in which light emitting elements for emitting light are formed, and an encapsulation layer for encapsulating the light emitting element layer.

The display layer DISL may be divided into a display area DA and a non-display area NDA. The display area DA may be an area at (e.g., in or on) which the pixels are arranged to display an image. The non-display area NDA may be an area at (e.g., in or on) which no image is displayed. The non-display area NDA may be disposed to surround (e.g., around a periphery of) the display area DA. In addition to the pixels, scan lines, data lines, driving voltage lines, and/or the like, which are connected to the pixels, may be arranged at (e.g., in or on) the display area DA. A scan driver for applying scan signals to the scan lines, fan-out lines for connecting the data lines to the display driver 200, and/or the like may be arranged at (e.g., in or on) the non-display area NDA.

The panel lower cover PB may be disposed under (e.g., underneath) the substrate SUB. For example, the panel lower cover PB may be attached to a lower surface of the substrate SUB through an adhesive member. The adhesive member may be a pressure sensitive adhesive (PSA). The panel lower cover PB may include at least one of a light absorbing member (e.g., a light absorbing layer) for absorbing light incident from the outside, a buffer member (e.g., a buffer layer) for absorbing shock from the outside, and a heat dissipation member (e.g., a heat dissipation layer) for efficiently dissipating heat of the display panel 100.

The light absorbing member may be disposed under (e.g., underneath) the substrate SUB. The light absorbing member may block transmission of light to prevent or substantially prevent the components disposed under (e.g., underneath) the light absorbing member, for example, the display circuit board 300 and/or the like, from being noticeable (e.g., from being seen) from above the display panel 100. For example, the light absorbing member may include a light absorbing material, such as a black pigment and/or a black dye.

The buffer member may be disposed under (e.g., underneath) the light absorbing member. The buffer member absorbs an external shock to prevent or substantially prevent the display panel 100 from being damaged. The buffer member may include (e.g., may be formed of) a single layer or a plurality of layers. For example, the buffer member may include (e.g., may be formed of) a polymer resin, for example, such as polyurethane, polycarbonate, polypropylene, or polyethylene, and/or may include (e.g., may be formed of) an elastic material, for example, such as a sponge obtained by foaming a rubber, a urethane-based material, or an acrylic material.

The heat dissipation member may be disposed under (e.g., underneath) the buffer member. The heat dissipation member may include a first heat dissipation layer including, for example, graphite or carbon nanotubes, and a second heat dissipation layer including (e.g., formed of) a metal thin film including, for example, copper, nickel, ferrite, or silver, which may block electromagnetic waves and may have excellent thermal conductivity.

The display driver 200 outputs signals and voltages for driving the display panel 100. For example, the display driver 200 may supply data voltages to the data lines. Further, the display driver 200 may supply driving voltages to the driving voltage lines, and may supply scan control signals to the scan driver. In an embodiment, the display driver 200 may be formed as an integrated circuit (IC), and may be attached to the display circuit board 300. In another embodiment, the display driver 200 may be attached onto the substrate SUB of the display panel 100 by a chip on glass (COG) method, a chip on plastic (COP) method, or an ultrasonic bonding method.

The display circuit board 300 may be disposed at (e.g., in or on) the non-display area NDA at a side (e.g., at one edge) of the display panel 100. For example, the display circuit board 300 may be disposed at (e.g., in or on) the non-display area NDA at the lower edge (e.g., the lower side) of the display panel 100. The display circuit board 300 may be bent toward a lower portion (e.g., a lower surface) of the display panel 100, and may be attached to one edge of the touch circuit board 410 disposed on the lower surface of the panel lower cover PB. The display circuit board 300 may be attached and fixed to the lower surface of the panel lower cover PB through an adhesive member 320. The adhesive member 320 may be a pressure sensitive adhesive. However, the present disclosure is not limited thereto, for example, in another embodiment, the display circuit board 300 may be omitted, and in this case, one edge (e.g., one side) of the substrate SUB may be bent toward the lower portion (e.g., the lower surface) of the display panel 100.

The display circuit board 300 may be attached onto display pads of the display panel 100 using an anisotropic conductive film. Thus, the display circuit board 300 may be electrically connected to the display pads of the display panel 100. The display circuit board 300 may be a flexible printed circuit board, a printed circuit board, or a flexible film, for example, such as a chip on film.

The touch panel 500 may be disposed on the display panel 100. The touch panel 500 may have a rectangular planar shape (e.g., a rectangular shape in a plan view) having short sides extending in the first direction (e.g., the X-axis direction), and long sides extending in the second direction (e.g., the Y-axis direction). A corner where the short side extending in the first direction (e.g., the X-axis direction) meets the long side extending in the second direction (e.g., the Y-axis direction) may be formed to have a rounded shape including a suitable curvature (e.g., a predetermined curvature), or may be formed to have a right angle shape. However, the planar shape of the touch panel 500 is not limited to the rectangular shape, and the touch panel 500 may be formed to have any suitable shape, for example, such as another polygonal shape, a circular shape, an elliptical shape, and/or the like. The planar shape of the touch panel 500 may be the same or substantially the same as (or similar to) the planar shape of the display panel 100.

The touch panel 500 may be formed to be flat, but the present invention is not limited thereto. For example, the touch panel 500 may include a curved portion formed at the left and right ends (e.g., left and right sides in a plan view) thereof. In this case, the curved portion may have a constant curvature or a variable curvature. In an embodiment, the touch panel 500 may be flexible to be bent, warped, folded, and/or rolled.

The touch panel 500 may include sensor electrodes disposed at (e.g., in or on) a touch sensor area to detect a user's touch, and sensor pads disposed at (e.g., in or on) a touch peripheral area disposed around (e.g., a periphery of) the touch sensor area. The sensor pads may be formed on the touch panel 500 at a side (e.g., at one edge) of the touch panel 500 to be electrically connected to the touch circuit board 410.

However the present disclosure is not limited thereto, and other embodiments, the touch panel 500 may be omitted. In this case, for example, a sensor electrode layer including the sensor electrodes and the sensor pads may be formed on (e.g., formed directly on) the display layer DISL of the display panel 100.

The touch circuit board 410 may be attached onto the sensor pads of the touch panel 500 using an anisotropic conductive film. Thus, the touch circuit board 410 may be electrically connected to the sensor pads of the touch panel 500. The touch circuit board 410 may be a flexible printed circuit board, a printed circuit board, or a flexible film, for example, such as a chip on film.

The touch driver 400 may be connected to sensor electrodes of the touch panel 500. The touch driver 400 applies touch driving signals to the sensor electrodes of the touch panel 500, and senses a voltage charged in a mutual capacitance formed by the sensor electrodes. The touch driving signal may be a signal having a plurality of driving pulses. The touch driver 400 may determine whether a user's touch is input according to (e.g., based on) the voltage charged in the mutual capacitance, and may calculate touch coordinates. The touch driver 400 may be formed as an integrated circuit (IC), and may be mounted on the touch circuit board 410.

A polarization film PF may be disposed on the touch panel 500 to prevent or substantially prevent the visibility of a display image of the display layer DISL due to reflection of external light. The polarization film PF may include a phase delay film, for example, such as a linear polarizing plate and a quarter-wave plate. The phase delay film may be disposed on a sensing layer SENL, and the linear polarizing plate may be disposed on the phase delay film.

Figure 4:
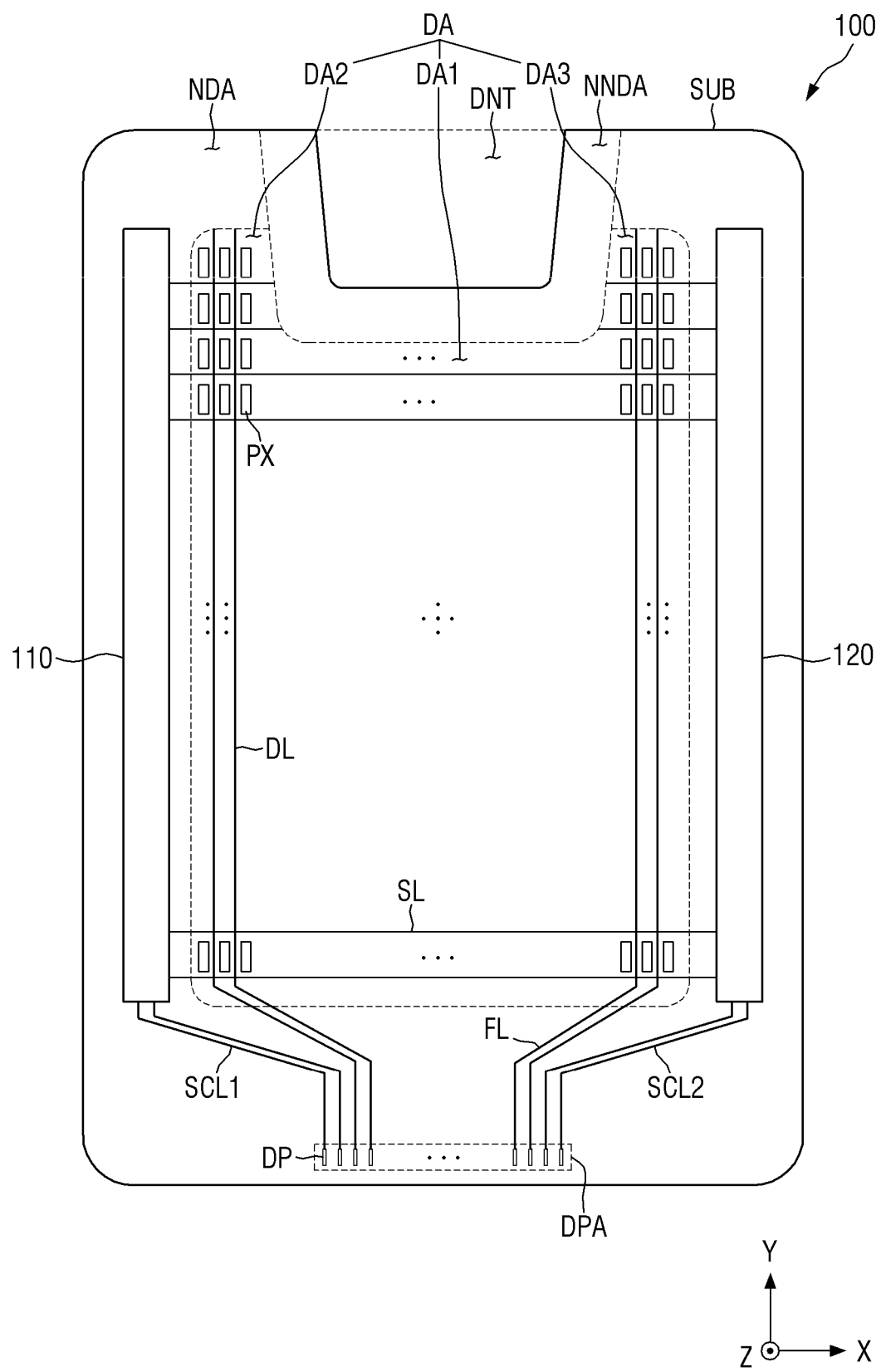
FIG. 4 is a plan view showing components of the display panel of FIG. 3.

FIG. 4 is a plan view showing the components of the display panel of FIG. 3.

For convenience, FIG. 4 shows pixels PX, scan lines SL, data lines DL, first scan control lines SCL1, second scan control lines SCL2, a first scan driver 110, a second scan driver 120, display pads DP, and fan out lines FL.

Referring to FIG. 4, the display panel 100 may include a display area DA in which the pixels PX are formed to display an image, and a non-display area NDA that may be a peripheral area of the display area DA. The non-display area NDA may be an area extending from the outside of the display area DA to an edge of the display panel 100. The display area DA may be formed to have a notch shape in which at least a part of one side of the display area DA is recessed concavely when viewed on a plane (e.g., in a plan view).

The display area DA may include a first display area DA1, a second display area DA2, and a third display area DA3. The first display area DA1 may have a rectangular shape in a plan view (e.g., a rectangular planar shape). The first display area DA1 may have short sides extending in the first direction (e.g., the X-axis direction), and long sides extending in the second direction (e.g., the Y-axis direction). The first display area DA1 may occupy most of the area of the display area DA. In other words, the first display area DA1 may define a majority of the display area DA.

The second display area DA2 and the third display area DA3 may protrude from one side of the first display area DA1 in the second direction (e.g., the Y-axis direction). For example, the second display area DA2 and the third display area DA3 may protrude from the upper side of the first display area DA in the second direction (e.g., the Y-axis direction).

The second display area DA2 may protrude from a first corner (e.g., an upper-left corner) of the first display area DA1, and the third display area DA3 may protrude from a second corner (e.g., an upper-right corner) of the first display area DA1. For example, the second display area DA2 may protrude from the first corner where the upper side of the first display area DA1 meets the left side of the first display area DA1, and the third display area DA3 may protrude from the second corner where the upper side of the first display area DA1 meets the right side of the first display area DA1.

A length of an upper side (e.g., extending in the X-axis direction) of the second display area DA2 may be shorter than a length of a lower side (e.g., extending in the X-axis direction) thereof. The lower side of the second display area DA2 may share a part (e.g., a portion) of the upper side of the first display area DA1. A right side of the second display area DA2 may be a curve (e.g., may have a curvature).

A length of an upper side (e.g., extending in the X-axis direction) of the third display area DA3 may be shorter than a length of a lower side (e.g., extending in the X-axis direction) thereof. The lower side of the third display area DA3 may share another part (e.g., another portion) of the upper side of the first display area DA1. A left side of the third display area DA3 may be a curve (e.g., may have a curvature). The left side of the third display area DA3 may be symmetrical or substantially symmetrical with (e.g., may mirror) the right side of the second display area DA2.

The second display area DA2 and the third display area DA3 may be spaced apart from each other in the first direction (e.g., the X-axis direction). A display notch area DNT may be disposed between the second display area DA2 and the third display area DA3. A notch non-display area NNDA may be disposed between the display notch area DNT and the non-display area NDA, between the display notch area DNT and the second display area DA2, between the display notch area DNT and the first display area DA1, and between the display notch area DNT and the third display area DA3. In other words, the notch non-display area NNDA may at least partially surround (e.g., around a periphery of) the display notch area DNT.

The scan lines SL, the data lines DL, and the pixels PX may be arranged at (e.g., in or on) the display area DA. The scan lines SL may be formed to extend in the first direction (e.g., the X-axis direction), and may be in parallel to each other along the second direction (e.g., the Y-axis direction). The data lines DL may be formed to extend in the second direction (e.g., the Y-axis direction), and may be in parallel to each other along the first direction (e.g., the X-axis direction).

Each of the pixels PX may be connected to at least one of the scan lines SL and any one of the data lines DL. Each of the pixels PX may include thin film transistors including, for example, a driving transistor and at least one switching transistor, an organic light emitting diode, and a capacitor. When a scan signal is applied from the scan line SL, each of the pixels PX receives a data voltage from the data line DL, and supplies a driving current to the organic light emitting diode according to the data voltage applied to a gate electrode of the driving transistor, thereby emitting light. The pixels PX will be described in more detail below with reference to FIG. 6.

The first scan driver 110, the second scan driver 120, the display driver 200, the first scan control lines SCL1, the second scan control lines SCL2, and the fan out lines FL may be arranged at (e.g., in or on) the non-display area NDA.

The first scan driver 110 is connected to the display driver 200 through the first scan control lines SCL1. Therefore, the first scan driver 110 may receive a first scan control signal of the display driver 200. The first scan driver 110 generates scan signals according to the first scan control signal, and supplies the scan signals to the scan lines SL.

The second scan driver 120 is connected to the display driver 200 through the second scan control lines SCL2. Therefore, the second scan driver 120 may receive a second scan control signal of the display driver 200. The second scan driver 120 generates scan signals according to the second scan control signal, and supplies the scan signals to the scan lines SL.

The first scan driver 110 may be connected to the scan lines SL that are connected to the pixels PX of the first display area DA1 and the second display area DA2. The second scan driver 120 may be connected to the scan lines SL that are connected to the pixels PX of the first display area DA1 and the third display area DA3.

The fan out lines FL connect the display pads DP to the data lines DL, the first scan driver 110, and the second scan driver 120. In other words, the fan out lines FL may be disposed between the display pads DP and the data lines DL, between the display pads DP and the first scan driver 110, and between the display pads DP and the second scan driver 120.

A display pad area DPA may include the display pads DP. The display pad area DPA may be disposed at one edge (e.g., a lower edge or a lower side) of the substrate SUB. For example, the display pad area DPA may be disposed at the lower edge of the substrate SUB.

Figure 5:
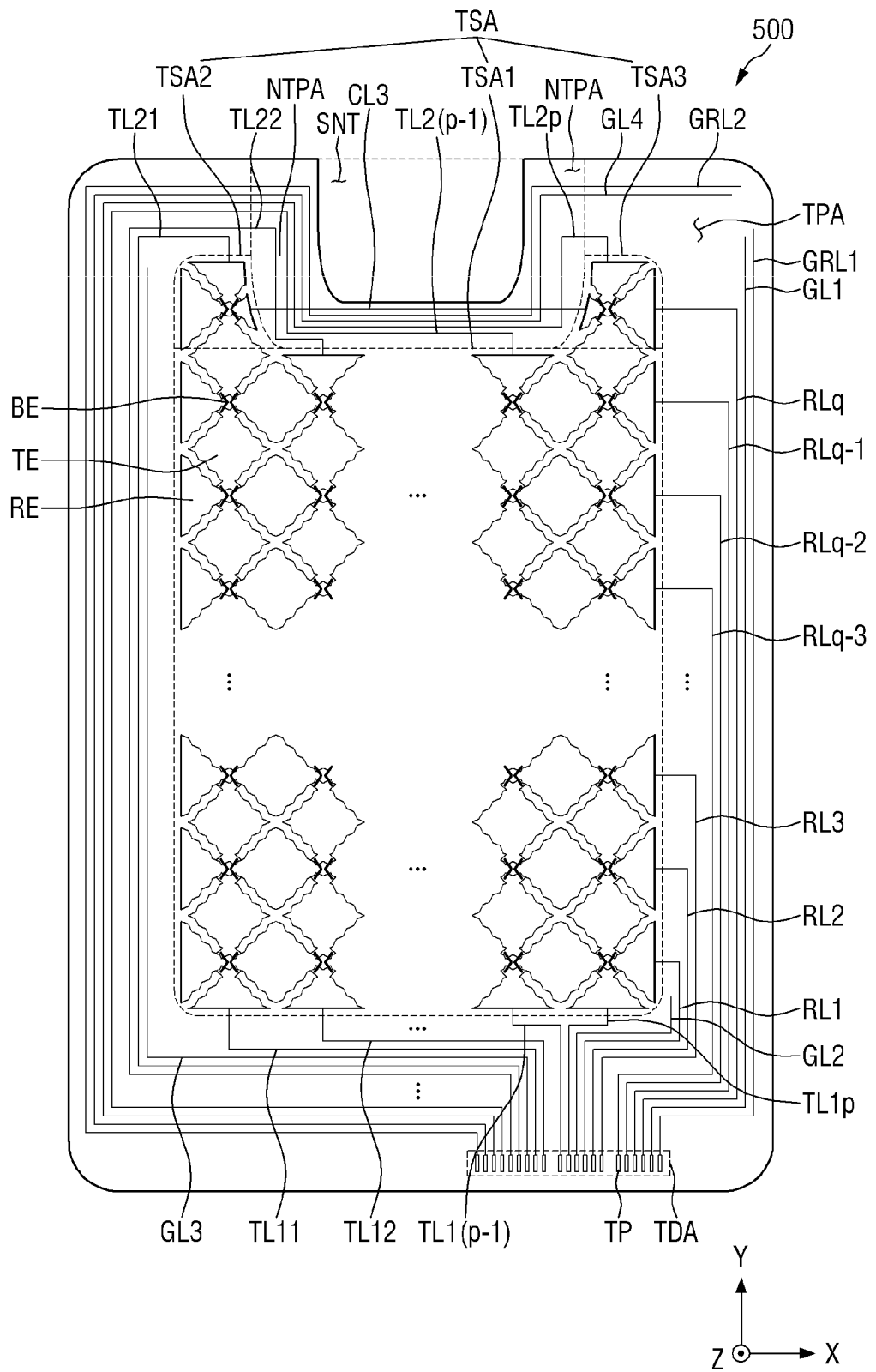
FIG. 5 is a plan view showing components of the touch panel of FIG. 3.

FIG. 5 is a plan view showing the components of the touch panel of FIG. 3.

Referring to FIG. 5, the touch panel 500 includes a sensor area TSA for sensing a user's touch, and a sensor peripheral area TPA disposed around (e.g., to surround a periphery of) the sensor area TSA. The sensor area TSA may overlap with the display area DA of the display panel 100, and the sensor peripheral area TPA may overlap with the non-display area NDA of the display panel 100.

The sensor area TSA may include a first sensor area TSA1, a second sensor area TSA2, and a third sensor area TSA3. The first sensor area TSA1 may have a rectangular shape in a plan view (e.g., a rectangular planar shape). The first sensor area TSA1 may have short sides extending in the first direction (e.g., the X-axis direction), and long sides extending in the second direction (e.g., the Y-axis direction). A corner (e.g., a lower-left corner) where a left side and a lower side of the first sensor area TSA1 meet each other may be rounded, and a corner (e.g., a lower-right corner) where a right side and the lower side of the first sensor area TSA1 meet each other may be rounded. The first sensor area TSA1 may occupy most of the area of the sensor area TSA. In other words, the first sensor area TSA1 may define (e.g., may constitute) a majority of the sensor area TSA.

The second sensor area TSA2 and the third sensor area TSA3 may protrude from one side of the first sensor area TSA1 in the second direction (e.g., the Y-axis direction). For example, the second sensor area TSA2 and the third sensor area TSA3 may protrude from the upper side of the first sensor area TSA1 in the second direction (e.g., the Y-axis direction).

The second sensor area TSA2 may protrude from a first corner (e.g., an upper-left corner) of the first sensor area TSA1, and the third sensor area TSA3 may protrude from a second corner (e.g., an upper-right corner) of the first sensor area TSA1. For example, the second sensor area TSA2 may protrude from the first corner where the upper side of the first sensor area TSA1 meets the left side of the first sensor area TSA1, and the third sensor area TSA3 may protrude from the second corner where the upper side of the first sensor area TSA1 meets the right side of the first sensor area TSA1.

A length of the upper side (e.g., extending in the X-axis direction) of the second sensor area TSA2 may be shorter than a length of the lower side (e.g., extending in the X-axis direction) thereof. The lower side of the second sensor area TSA2 may share a part (e.g., a portion) of the upper side of the first sensor area TSA1. The right side of the second sensor area TSA2 may be a curve (e.g., may have a curvature). The corner where the left side and the upper side of the second sensor area TSA2 meet each other may be rounded.

A length of the upper side (e.g., extending in the X-axis direction) of the third sensor area TSA3 may be shorter than a length of the lower side (e.g., extending in the X-axis direction) thereof. The lower side of the third sensor area TSA3 may share another part (e.g., another portion) of the upper side of the first sensor area TSA1. The left side of the third sensor area TSA3 may be a curve (e.g., may have a curvature). The left side of the third sensor area TSA3 may be symmetrical or substantially symmetrical with (e.g., may mirror) the right side of the second sensor area TSA2.

The second sensor area TSA2 and the third sensor area TSA3 may be spaced apart from each other in the first direction (e.g., the X-axis direction). A sensor notch area SNT may be disposed between the second sensor area TSA2 and the third sensor area TSA3. A notch peripheral area NTPA may be disposed between the sensor notch area SNT and the sensor peripheral area TPA, between the sensor notch area SNT and the second sensor area TSA2, between the sensor notch area SNT and the first sensor area TSA1, and between the sensor notch area SNT and the third sensor area TSA3. In other words, the notch peripheral area NTPA may at least partially surround (e.g., around a periphery of) the sensor notch area SNT.

The first sensor area TSA1 may overlap with the first display area DA1 in the third direction (e.g., the Z-axis direction), the second sensor area TSA2 may overlap with the second display area DA2 in the third direction (e.g., the Z-axis direction), and the third sensor area TSA3 may overlap with the third display area DA3 in the third direction (e.g., the Z-axis direction). The sensor notch area SNT may overlap with the display notch area DNT in the third direction (e.g., the Z-axis direction).

The pixels PX may not be arranged at (e.g., in or on) the display notch area DNT. The sensor lines and the sensor electrodes may not be arranged at (e.g., in or on) the sensor notch area SNT. Therefore, when the display device 10 is implemented with a mobile phone, a smart phone, a tablet personal computer, and/or the like, a camera device, a proximity sensor device, an illumination sensor device, an iris sensor device, and/or the like may be disposed to overlap with the sensor notch area SNT in the third direction (e.g., the Z-axis direction). Thus, the sensor notch area SNT in which the camera device, the proximity sensor device, the illumination sensor device, and/or the iris sensor device of the mobile phone, the smart phone, and/or the tablet personal computer are arranged may be reduced.

Sensor electrodes TE and RE may be arranged at (e.g., in or on) the sensor area TSA. The sensor electrodes TE and RE may include driving electrodes TE and sensing electrodes RE.

The driving electrodes TE and the sensing electrodes RE may be arranged at (e.g., in or on) the sensor area TSA. The driving electrodes TE and the sensing electrodes RE may be spaced apart from each other. The driving electrodes TE may be arranged in a plurality of columns extending in the second direction (e.g., the Y-axis direction), and the sensing electrodes RE may be arranged in a plurality of rows extending in the first direction (e.g., the X-axis direction). The driving electrodes TE arranged in each of the plurality of columns extending in the second direction (e.g., the Y-axis direction) may be electrically connected to each other. Further, the sensing electrodes RE arranged in each of the plurality of rows extending in the first direction (e.g., the X-axis direction) may be electrically connected to each other. For example, the driving electrodes TE arranged in the same column may be electrically connected to each other, and the sensing electrodes RE arranged in the same row may be electrically connected to each other.

The driving electrodes TE and the sensing electrodes RE may be arranged at (e.g., in or on) all of (e.g., each of) the first sensor area TSA1, the second sensor area TSA2, and the third sensor area TSA3. The driving electrodes TE and the sensing electrodes RE arranged at (e.g., in or on) the first sensor area TSA1 may be formed in a diamond shape or a triangle shape in a plan view. For example, the driving electrodes TE and the sensing electrodes RE arranged at the edge (e.g., arranged adjacent to the edge) of the first sensor area TSA1 may be formed in a triangular shape in a plan view, and the other driving electrodes TE and the other sensing electrodes RE may be formed in a diamond shape in a plan view. At (e.g., in or on) each of the second sensor area TSA2 and the third sensor area TSA3, at least one driving electrode TE and/or at least one sensing electrode RE may have an amorphous shape. Further, in order to prevent or substantially prevent a Moire phenomenon (e.g., a Moire effect or a Moire pattern) caused by the driving electrodes TE and the sensing electrodes RE when viewing an image of the display device 10, the driving electrodes TE and the sensing electrodes RE may have convex sides in a plan view. However, the planar shapes of the driving electrodes TE and the sensing electrodes RE disposed at (e.g., in or on) the first sensor area TSA1 are not limited to those shown in FIG. 5.

In order to prevent or substantially prevent the driving electrodes TE and the sensing electrodes RE from shorting with each other at their crossing regions, the driving electrodes TE that are adjacent to each other in the second direction (e.g., the Y-axis direction) may be electrically connected to each other through a connection electrode BE. In this case, the driving electrodes TE and the sensing electrodes RE may be arranged at (e.g., in or on) one layer, and the connection electrode BE may be disposed at (e.g., in or on) a different layer from that of the driving electrodes TE and the sensing electrodes RE. Thus, the driving electrodes TE electrically connected to each other in the second direction (e.g., the Y-axis direction) and the sensing electrodes RE electrically connected to each other in the first direction (e.g., the X-axis direction) may be electrically insulated from each other.

First driving signal lines TL11 to TL1$p$ (where p is a positive integer greater than or equal to 2), second driving signal lines TL21 to TL2$p$, sensing signal lines RL1 to RL$q$ (where q is a positive integer greater than or equal to 2), and touch pads TP may be arranged at (e.g., in or on) the sensor peripheral area TPA.

One ends (e.g., first ends) of the first driving signal lines TL11 to TL1$p$ may be connected to the driving electrodes TE that are arranged at a first side (e.g., a lower side) of the sensor area TSA (e.g., a lower side of the first sensor area TSA1). The first side of the sensor area TSA may correspond to (e.g., may be) a side of the sensor area TSA from among four sides of the sensor area TSA that is closest to the touch pad area TDA where the touch pads TP are arranged. For example, the first side of the sensor area TSA may be a lower side of the sensor area TSA (e.g., a lower side of the first sensor area TSA1). Other ends (e.g., second ends) of the first driving signal lines TL11 to TL1$p$ may be connected to some of the touch pads TP of the touch pad area TDA. In other words, the first driving signal lines TL11 to TL1$p$ may serve to connect the driving electrodes TE arranged at the first side of the sensor area TSA to first touch pads from among the touch pads TP at (e.g., in or on) the touch pad area TDA.

One ends (e.g., first ends) of the second driving signal lines TL21 to TL2$p$ may be connected to the driving electrodes TE arranged at a second side (e.g., an upper side) of the sensor area TSA (e.g., an upper side of the first sensor area TSA1, the second sensor area TSA2, and the third sensor area TSA3). The second side of the sensor area TSA is a side of the sensor area TSA that is opposite to the first side of the sensor area TSA, and may be the side at which the sensor notch area SNT is formed. For example, the second side of the sensor area TSA may be an upper side of the sensor area TSA (e.g., an upper side of the first sensor area TSA1, the second sensor area TSA2, and the third sensor area TSA3). Other ends (e.g., second ends) of the second driving signal lines TL21 to TL2$p$ may be connected to others of the touch pads TP of the touch pad area TDA. In other words, the second driving signal lines TL21 to TL2$p$ may serve to connect the driving electrodes TE arranged at the second side of the sensor area TSA to second touch pads from among the touch pads TP at (e.g., in or on) the touch pad area TDA. The second driving signal lines TL21 to TL2$p$ may be connected to the driving electrodes TE arranged at the upper side of the sensor area TSA via the lower outer side and the left outer side of the sensor area TSA (e.g., via the lower side and the left side of the sensor peripheral area TPA).

One ends (e.g., first ends) of the sensing signal lines RL1 to RLq may be connected to the sensing electrodes RE arranged at a third side (e.g., a right side) of the sensor area TSA. For example, the third side of the sensor area TSA may be a right side of the sensor area TSA. Other ends (e.g., second ends) of the sensing signal lines RL1 to RLq may be connected to remaining touch pads TP of the touch pad area TDA. In other words, the sensing signal lines RL1 to RLq may serve to connect the sensing electrodes RE arranged at the third side of the sensor area TSA to third touch pads from among the touch pads TP at (e.g., in or on) the touch pad area TDA.

The touch pads TP may be arranged at one side (e.g., a lower side) of the touch panel 500. The touch circuit board 410 may be attached onto the touch pads TP using an anisotropic conductive film. Thus, the touch pads TP may be electrically connected to the touch circuit board 410.

A first guard line GL1, a second guard line GL2, a third guard line GL3, a fourth guard line GL4, a first ground line GRL1, and a second ground line GRL2 may be disposed at (e.g., in or on) the sensor peripheral area TPA.

The first guard line GL1 may be disposed outside the qth sensing signal line RLq disposed at the outermost side of the sensing signal lines RL1 to RLq. Further, the first ground line GRL1 may be disposed outside the first guard line GL1. In other words, because the first guard line GL1 is disposed between the first ground line GRL1 and the qth sensing signal line RLq disposed at the outermost side of the sensing signal lines RL1 to RLq, the first guard line GL1 may serve to reduce or minimize an influence of a voltage change of the first ground line GRL1 on the qth sensing signal line RLq. One end (e.g., a first end) of the first guard line GL1 and one end (e.g., a first end) of the first ground line GRL1 may be connected to corresponding ones (e.g., any one) of the touch pads TP.

The second guard line GL2 may be disposed between the first sensing signal line RL1 disposed at the leftmost side of the sensing signal lines RL1 to RLq and the pth first driving signal line TL1p disposed at the rightmost side of the first driving signal lines TL11 to TL1p. Thus, the second guard line GL2 may serve to reduce or minimize an influence of the sensing signal lines RL1 to RLq and the first driving signal lines TL11 to TL1p on each other. One end (e.g., a first end) of the second guard line GL2 may be connected to a corresponding one (e.g., any one) of the touch pads TP.

The third guard line GL3 may be disposed between the first driving signal line TL11 disposed at the leftmost side of the first driving signal lines TL11 to TL1p and the second driving signal line TL21 disposed at the rightmost side of the second driving signal lines TL21 to TL2p. Thus, the third guard line GL3 may serve to reduce or minimize an influence of the first driving signal lines TL11 to TL1p and the second driving signal lines TL21 to TL2p on each other. One end (e.g., a first end) of the third guard line GL3 may be connected to a corresponding one (e.g., any one) of the touch pads TP.

The fourth guard line GL4 may be disposed outside the pth second driving signal line TL2p disposed at the leftmost side of the second driving signal lines TL21 to TL2p. Further, the second ground line GRL2 may be disposed outside the fourth guard line GL4. In other words, because the fourth guard line GL4 is disposed between the second ground line GRL2 and the pth second driving signal line TL2p disposed at the outermost side of the second driving signal lines TL21 to TL2p, the fourth guard line GL4 may serve to reduce or minimize an influence of a voltage change of the second ground line GRL2 on the second driving signal lines TL21 to TL2p. One end (e.g., a first end) of the fourth guard line GL4 and one end (e.g., a first end) of the second ground line GRL2 may be connected to corresponding ones (e.g., any one) of the touch pads TP.

Ground voltages may be applied to the first guard line GL1, the second guard line GL2, the third guard line GL3, and the fourth guard line GL4.

The first ground line GRL1 is disposed at the outermost side of the right side of the touch panel 500, and the second ground line GRL2 is disposed at the outermost side of the lower side, the left side, and the upper side of the touch panel 500. Further, the ground voltages are applied to the first ground line GRL1 and the second ground line GRL2. Thus, when static electricity is applied from the outside, the static electricity may be discharged to the first ground line GRL1 and/or the second ground line GRL2.

Figure 6:
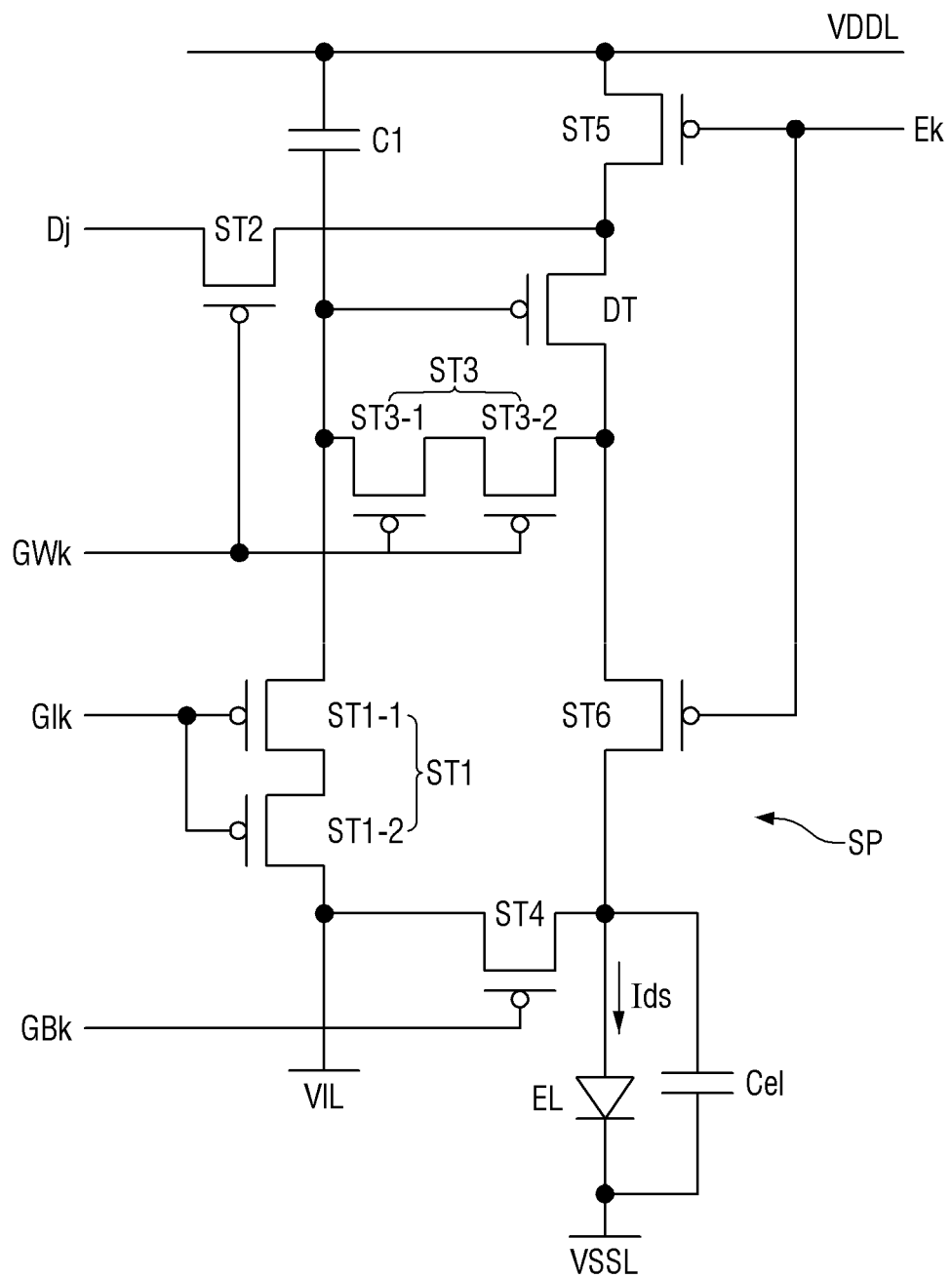
FIG. 6 is a detailed circuit diagram of the pixel of FIG. 4.

FIG. 6 is a detailed circuit diagram of the pixel of FIG. 4.

Referring to FIG. 6, the pixel PX may be connected to a kth gate initialization line GIk (where k is a positive integer), a kth write signal line GWk, and a kth anode initialization line GBk. Further, the pixel PX may be connected to a first driving voltage line VDDL to which a first driving voltage is supplied, an initialization voltage line VIL to which an initialization voltage Vini is supplied, and a second driving voltage line VSSL to which a second driving voltage is supplied.

The pixel PX includes a driving transistor DT, a light emitting element EL, switch elements, and a capacitor C1. The switch elements may include, for example, first to sixth transistors ST1, ST2, ST3, ST4, ST5, and ST6.

The driving transistor DT may include a gate electrode, a first electrode, and a second electrode. The driving transistor DT controls a drain-source current Ids (hereinafter referred to as a "driving current") flowing between the first electrode and the second electrode according to the data voltage applied to the gate electrode. The driving current Ids flowing through the channel of the driving transistor DT may be proportional to a square of a difference between a gate-source voltage Vsg and a threshold voltage Vth of the driving transistor DT, as shown in Equation 1 below.

$$Ids = k' \times (Vgs - Vth)^2 \qquad \text{Equation 1}$$

In Equation 1, k' is a proportional coefficient determined by the structure and physical characteristics of the driving transistor DT, $V_gs$ is the gate-source voltage of the driving transistor DT, and Vth is the threshold voltage of the driving transistor DT.

The light emitting element EL emits light in accordance with the driving current Ids. A light emission amount of the light emitting element EL may be proportional to the driving current Ids.

In an embodiment, the light emitting element EL may be an organic light emitting diode including an anode electrode, a cathode electrode, and an organic light emitting layer disposed between the anode electrode and the cathode electrode. In another embodiment, the light emitting element EL may be an inorganic light emitting element including an anode electrode, a cathode electrode, and an inorganic semiconductor disposed between the anode electrode and the cathode electrode. In another embodiment, the light emitting element EL may be a quantum dot light emitting element including an anode electrode, a cathode electrode, and a quantum dot light emitting layer disposed between the anode electrode and the cathode electrode. In another embodiment, the light emitting element EL may be a micro light emitting diode.

The anode electrode of the light emitting element EL may be connected to a first electrode of the fourth transistor ST4 and a second electrode of the sixth transistor ST6. The cathode electrode of the light emitting element EL may be connected to the second driving voltage line VSSL. A parasitic capacitance Cel may be formed between the anode electrode and cathode electrode of the light emitting element EL.

The first transistor ST1 may be a dual transistor including a first-first transistor ST1-1 and a first-second transistor ST1-2. The first-first transistor ST1-1 and the first-second transistor ST1-2 are turned on by a first initialization signal of the gate initialization line GIk to connect the gate electrode of the driving transistor DT to the initialization voltage line VIL. The gate electrode of the driving transistor DT may be discharged to the initialization voltage of the initialization voltage line VIL. A gate electrode of the first-first transistor ST1-1 may be connected to the gate initialization line GIk, a first electrode thereof may be connected to the gate electrode of the driving transistor DT, and a second electrode thereof may be connected to a first electrode of the first-second transistor ST1-2. A gate electrode of the first-second transistor ST1-2 may be connected to the gate initialization line GIk, the first electrode thereof may be connected to the second electrode of the first-first transistor ST1-1, and the second electrode thereof may be connected to the initialization voltage line VIL.

The second transistor ST2 is turned on by a write signal of the write signal line GWk to connect the first electrode of the driving transistor DT to a jth data line Dj (where j is a positive integer). A gate electrode of the second transistor ST2 may be connected to the write signal line GWk, a first electrode thereof may be connected to the first electrode of the driving transistor DT, and a second electrode thereof may be connected to the jth data line Dj.

The third transistor ST3 may be a dual transistor including a third-first transistor ST3-1 and a third-second transistor ST3-2. The third-first transistor ST3-1 and the third-second transistor ST3-2 are turned on by the write signal of the write signal line GWk to connect the gate electrode of the driving transistor DT to the first electrode of the driving transistor DT. In other words, when the third-first transistor ST3-1 and the third-second transistor ST3-2 are turned on, the gate electrode of the driving transistor DT is connected to the first electrode of the driving transistor DT, so that the driving transistor DT is driven as a diode (e.g., is diode-connected). A gate electrode of the third-first transistor ST3-1 may be connected to the write signal line GWk, a first electrode thereof may be connected to a second electrode of the third-second transistor ST3-2, and a second electrode thereof may be connected to the gate electrode of the driving transistor DT. A gate electrode of the third-second transistor ST3-2 may be connected to the write signal line GWk, a first electrode thereof may be connected to the second electrode of the driving transistor DT, and the second electrode thereof may be connected to the first electrode of the third-first transistor ST3-1.

The fourth transistor ST4 is turned on by an initialization signal (e.g., a scan signal) of the anode initialization line GBk to connect the anode electrode of the light emitting element EL to the initialization voltage line VIL. The anode electrode of the light emitting element EL may be discharged to an initialization voltage of the initialization voltage line VIL. A gate electrode of the fourth transistor ST4 may be connected to the anode initialization line GBk, a first electrode thereof may be connected to the anode electrode of the light emitting element EL, and a second electrode thereof may be connected to the initialization voltage line VIL.

The fifth transistor ST5 is turned on by a light emission control signal of a kth light emitting line Ek to connect the first electrode of the driving transistor DT to the first driving voltage line VDDL. A gate electrode of the fifth transistor ST5 is connected to the kth light emitting line Ek, a first electrode thereof is connected to the first driving voltage line VDDL, and a second electrode thereof is connected to the first electrode (e.g., the source electrode) of the driving transistor DT.

The sixth transistor ST6 is connected between the second electrode of the driving transistor DT and the anode electrode of the light emitting element EL. The sixth transistor ST6 is turned on by the light emission control signal of the kth light emitting line Ek to connect the second electrode of the driving transistor DT to the anode electrode of the light emitting element EL. A gate electrode of the sixth transistor ST6 is connected to the kth light emitting line Ek, a first electrode thereof is connected to the second electrode of the driving transistor DT, and a second electrode thereof is connected to the anode electrode of the light emitting element EL. When both the fifth transistor ST5 and the sixth transistor ST6 are turned on, the driving current Ids may be supplied to the light emitting element EL.

The capacitor C is formed between the gate electrode of the driving transistor DT and the first driving voltage line VDDL. One electrode of the capacitor C may be connected to the gate electrode of the driving transistor DT, and another electrode thereof may be connected to the first driving voltage line VDDL.

One of the first electrode and the second electrode of each of the driving transistor DT and the first to sixth transistors ST1, ST2, ST3, ST4, ST5, and ST6 may be a source electrode, and the other thereof may be a drain electrode. For example, when the first electrode of each of the driving transistor DT and the first to sixth transistors ST1, ST2, ST3, ST4, ST5, and ST6 is a source electrode, the second electrode thereof may be a drain electrode. In another example, when the first electrode of each of the driving transistor DT and the first to sixth transistors ST1, ST2, ST3, ST4, ST5, and ST6 is a drain electrode, the second electrode thereof may be a source electrode.

An active layer of each of the driving transistor DT and the first to sixth transistors ST1, ST2, ST3, ST4, ST5, and ST6 may be formed of any suitable one of polysilicon, amorphous silicon, and an oxide semiconductor. When the active layer of each of the driving transistor DT and the first to sixth transistors ST1, ST2, ST3, ST4, ST5, and ST6 is formed of polysilicon, a process of forming the active layer may include (e.g., may be) a low-temperature polysilicon (LTPS) process.

Although FIG. 6 illustrates that the driving transistor DT and the first to sixth transistors ST1, ST2, ST3, ST4, ST5, and ST6 are formed of P-type metal oxide semiconductor field effect transistors (MOSFETs), the present invention is not limited thereto. For example, in other embodiments, any one or more of the driving transistor DT and the first to sixth transistors ST1, ST2, ST3, ST4, ST5, and ST6 may be formed of N-type MOSFETs.

The first driving voltage of the first driving voltage line VDDL, the second driving voltage of the second driving voltage line VSSL, and the initialization voltage of the initialization voltage line VIL may be set in consideration of the characteristics of the driving transistor DT and the characteristics of the light emitting element EL. For example, a voltage difference between the initialization voltage and the data voltage supplied to the source electrode of the driving transistor DT may be set to be smaller than the threshold voltage of driving transistor DT.

In an embodiment, the gate initialization line GIk may be a k−1th scan line (e.g., a previous scan line), and the anode initialization line GBk and the write signal line GWk may be a kth scan line (e.g., a current scan line). In this case, the second initialization signal of the anode initialization line GBk may be the same or substantially the same as the write signal of the write signal line GWk, but the present invention is not limited thereto.

Figure 7:
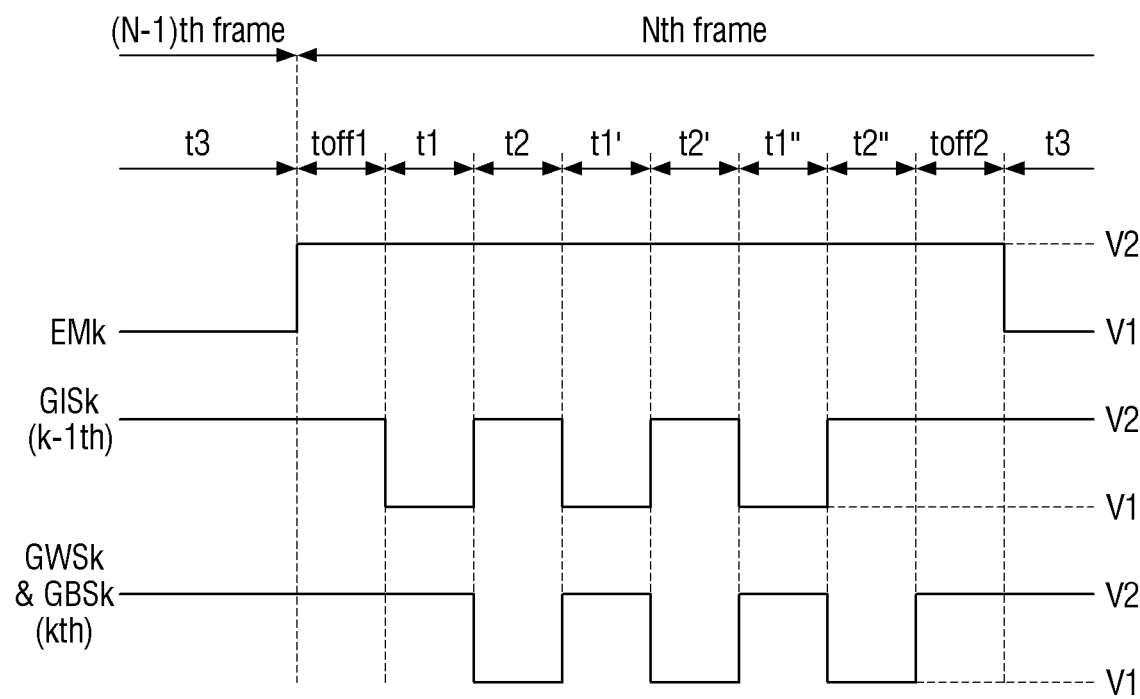
FIG. 7 is a waveform diagram showing signals applied to the k−1th scan line, the kth scan line, and the kth light emitting line of FIG. 6.

FIG. 7 is a waveform diagram showing signals applied to the k−1th scan line (e.g., the gate initialization line GIk), the kth scan line (e.g., the anode initialization line GBk and the write signal line GWk), and the kth light emitting line (e.g., Ek) of FIG. 6.

Referring to FIG. 7, the kth gate initialization signal GISk applied to the kth gate initialization line GIk is a signal for controlling an operation (e.g., turn-on and turn-off) of the first transistor ST1. The kth write signal GWSk applied to the kth write signal line GWk is a signal for controlling an operation (e.g., turn-on and turn-off) of each of the second transistor ST2 and the third transistor ST3.

The kth anode initialization signal GBSk applied to the kth anode initialization line GBk is a signal for controlling an operation (e.g., turn-on and turn-off) of the fourth transistor ST4. The kth light emission signal EMk applied to the kth light emitting line Ek is a signal for controlling operations (e.g., turn-on and turn-off) of the fifth transistor ST5 and the sixth transistor ST6.

The kth gate initialization signal GISk, the kth write signal GWSk, the kth anode initialization signal GBSk, and the kth light emission signal EMk may be periodically generated during one frame period. One frame period includes a plurality of first periods t1, t1', and t1", a plurality of second periods t2, t2', and t2", a third period t3, a first off period toff1, and a second off period toff2. Each of the plurality of first periods t1, t1', and t1" may be a period for applying an on-bias voltage (e.g., an on-bias signal) to the driving transistor DT by applying an initialization voltage Vini to the gate electrode of the driving transistor DT. Each of the plurality of second periods t2, t2', and t2" may be a period for supplying a data voltage to the gate electrode of the driving transistor DT, and sampling a threshold voltage of the driving transistor DT. The third period t3 may be a period during which the light emitting element EL emits light according to the voltage of the gate electrode of the driving transistor DT. The first off period toff1 may be located before the first period t1, which is a first (e.g., a most previous period) from among the first periods t1, t1', and t1". The second off period toff2 may be located after the second period t2", which is a last period from among the second periods t2, t2', and t2". Each of the first off period toff1 and the second off period toff2 may be a period during which each of (e.g., all of) the driving transistor DT and the first to sixth transistors ST1, ST2, ST3, ST4, ST5, and ST6 are turned off (e.g., are in an off state).

The plurality of first periods t1, t1', and t1" and the plurality of second periods t2, t2', and t2" may be alternately repeated (e.g., may alternately repeat with each other). For example, the plurality of first periods t1, t1', and t1" and the plurality of second periods t2, t2', and t2" may be arranged in an order of the first period t1, the second period t2, the first period t1', the second period t2', the first period t1", and the second period t2". While FIG. 7 shows that one frame period may include three first periods t1, t1', and t1" and three second periods t2, t2', and t2", the present invention is not limited thereto. For example, one frame period may include one first period t1 and one second period t2, two first periods t1 and t1' and two second periods t2 and t2', four or more first periods and four or more second periods, and/or the like. In this case, the number of first periods in one frame period may be equal to or substantially equal to the number of second periods in one frame period.

The kth gate initialization signal GISk may be output as a first level voltage V1 during the plurality of first periods t1, t1', and t1", and may be output as a second level voltage V2 during the plurality of second periods t2, t2', and t2". For example, the kth gate initialization signal GISk may have the first level voltage V1 during the plurality of first periods t1, t1', and t1", and may have the second level voltage V2 during the other remaining periods. The kth write signal GWSk and the kth anode initialization signal GBSk may have the first level voltage V1 during the plurality of second periods t2, t2', and t2", and may have the second level voltage V2 during the other remaining periods. The kth light emission signal EMk may have the first level voltage V1 during the third period t3, and may have the second level voltage V2 during the other remaining periods.

As illustrated in FIG. 5, each of the plurality of first periods t1, t1', and t1", the plurality of second periods t2, t2', and t2", the first off period toff1, and the second off period toff2 defines (e.g., may be included in) one horizontal period. Because one horizontal period indicates a period in which a data voltage is supplied to each of the pixels PX disposed at (e.g., in or on) one horizontal line of the display panel 100, the one horizontal period may be defined as one horizontal line scan period. The pixels PX disposed at (e.g., in or on) one horizontal line may be defined as pixels PX connected to one gate initialization line, one write signal line, one anode initialization line, and one light emitting line. The data voltages may be supplied to the data lines DL in synchronization with the first level voltage V1 of each of the scan signals.

The first level voltage V1 corresponds to a scan on voltage capable of turning on each of the first to sixth transistors ST1, ST2, ST3, ST4, ST5, and ST6. The second level voltage V2 corresponds to a scan off voltage capable of turning off each of the first to sixth transistors ST1, ST2, ST3, ST4, ST5, and ST6. In an embodiment, the first level voltage V1 may be about (e.g., may be equal to or substantially equal to) −8 V, and the second level voltage V2 may be about (e.g., may be equal to or substantially equal to) 7 V. The initialization voltage Vini may be higher than (e.g., may be greater than) the first level voltage V1, and may be lower than (e.g., may be less than) the second level voltage V2. For example, in an embodiment, the initialization voltage Vini may be about (e.g., may be equal to or substantially equal to) −3.5V.

Hereinafter, operations of the pixel PX during the first off period toff1, the plurality of first periods t1, t1', and t1", the plurality of second periods t2, t2', and t2", the second off period toff2, and the third period t3 will be described in more detail with reference to FIGS. 6 and 7.

First, the driving transistor DT and the first to sixth transistors ST1, ST2, ST3, ST4, ST5, and ST6 of the pixel PX are turned off during the first off period toff1.

Second, the kth gate initialization signal GISk having the first level voltage V1 is supplied to the kth gate initialization line GIk during each of the plurality of first periods t1, t1', and t1". In this case, the first transistor ST1 is turned on by the kth gate initialization signal GISk having the first level voltage V1 during each of the plurality of first periods t1, t1', and t1". When the first transistor ST1 is turned on, the initialization voltage Vini of the initialization voltage line VIL is applied to the gate electrode of the driving transistor DT.

When the light emitting element EL is to display a white luminance while displaying a black luminance, the driving current Ids of the driving transistor DT may increase in a step shape according to hysteresis characteristics of the driving transistor DT, and thus, the luminance of the light emitting element EL may also increase in a step shape. The curve of the driving current Ids of the driving transistor DT may be positively shifted when the light emitting element EL displays the black luminance, and the curve of the driving current Ids of the driving transistor DT may be negatively shifted when the light emitting element EL displays the white luminance. When the light emitting element EL is to display the white luminance while displaying the black luminance, the curve of the driving current Ids of the driving transistor DT may be negatively shifted. Therefore, even when the same data voltage is applied, the driving current Ids of the driving transistor DT supplied to the light emitting element EL may increase in a step shape during second to fourth frame periods FR2 to FR4. Accordingly, the luminance of light emitted from the light emitting element EL may also increase in a step shape during the second to fourth frame periods FR2 to FR4.

In order to reduce a difference in luminance between frame periods, which may be caused by the increase in luminance of the light emitting element EL in a step shape due to the hysteresis characteristics of the driving transistor DT, an on bias voltage (e.g., an on bias signal) may be applied to the driving transistor DT during each of the plurality of first periods t1, t1', and t1". For example, when the initialization voltage Vini is applied to the gate electrode of the driving transistor DT during each of the plurality of first periods t1, t1', and t1", the driving transistor DT may be turned on because the voltage between the gate electrode and the first electrode of the driving transistor DT may be lower than the threshold voltage Vth of the driving transistor DT. In other words, the on bias voltage may be applied to the driving transistor DT.

Third, the kth write signal GWSk having the first level voltage V1 is supplied to the kth write signal line GWk during each of the plurality of second periods t2, t2', and t2". During each of the plurality of second periods t2, t2', and t2", as shown in FIG. 7, each of the second transistor ST2 and the third transistor ST3 is turned on by the kth write signal GWSk having the first level voltage V1.

During each of the plurality of second periods t2, t2', and t2", when the third transistor ST3 is turned on, the gate electrode and the second electrode of the driving transistor DT are connected to each other, and the driving transistor DT is driven as a diode (e.g., is diode-connected). When the second transistor ST2 is turned on, the data voltage Vdata is supplied to the first electrode of the driving transistor DT. In this case, because the voltage Vgs (e.g., Vgs=Vini−Vdata) between the gate electrode and the first electrode of the driving transistor DT is lower than the threshold voltage Vth, the driving transistor DT forms a current path until the voltage Vgs between the gate electrode and the source electrode of the driving transistor DT reaches the threshold voltage Vth. Thus, during each of the plurality of second periods t2, t2', and t2", the voltage Vgs between the gate electrode and the second electrode of the driving transistor DT increases to the voltage Vdata+Vth, which is the sum of the data voltage Vdata and the threshold voltage Vth of the driving transistor DT. The voltage "Vdata+Vth" may be stored in the capacitor C1.

Because the driving transistor DT may be formed as a P-type MOSFET, in this case the driving current Ids of the driving transistor DT may be inversely proportional to the voltage Vgs between the gate electrode and the source electrode of the driving transistor DT in a section in which the voltage Vgs between the gate electrode and the source electrode of the driving transistor DT is lower than (e.g., is less than) 0V. Further, because the driving transistor DT may be formed as a P-type MOSFET, the threshold voltage Vth thereof may be lower than (e.g., may be less than) 0V.

Further, the kth anode initialization signal GBSk having the first level voltage V1 is supplied to the kth anode initialization line GBk. Therefore, during each of the plurality of second periods t2, t2', and t2", the fourth transistor ST4 is turned on by the kth anode initialization signal GBSk having the first level voltage V1. When the fourth transistor ST4 is turned on, the anode electrode of the light emitting element EL may be initialized to the initialization voltage Vini of the initialization voltage line VIL.

As shown in FIG. 7, the plurality of first periods t1, t1', and t1" and the plurality of second periods t2, t2', and t2" may be alternately repeated, thereby applying an on bias voltage to the driving transistor DT during each of the plurality of first periods t1, t1', and t1". Therefore, when one frame period includes the plurality of first periods t1, t1', and t1", an increase in luminance of the light emitting element EL in a step shape due to the hysteresis characteristics of the driving transistor DT may be further reduced, as compared with a case when one frame period includes one first period.

Fourth, the driving transistor DT and the first to sixth transistors ST1, ST2, ST3, ST4, ST5, and ST6 of the pixel PX may be turned off during the second off period toff2. During the second off period toff2, the gate electrode of the driving transistor DT may maintain or substantially maintain a voltage (e.g., "Vdata+Vth") by the capacitor C1.

Fifth, the kth light emission signal EMk having the first level voltage V1 is supplied to the kth light emitting line Ek during the third period t3. Each of the fifth and sixth transistors ST5 and ST6 is turned on by the kth light emission signal EMk having the first level voltage V1 during the third period t3.

When the fifth transistor ST5 is turned on, the first electrode of the driving transistor DT is connected to the first driving voltage line VDDL. When the sixth transistor ST6 is turned on, the second electrode of the driving transistor DT is connected to the anode electrode of the light emitting element EL.

When the fifth transistor ST5 and the sixth transistor ST6 are turned on, the driving current Ids flowing according to the voltage of the gate electrode of the driving transistor DT may be supplied to the light emitting element EL. The driving current Ids may be defined by Equation 2.

$$Ids = k' \times (ELVDD - (Vdata + Vth) - Vth)^2 \qquad \text{Equation 2}$$

In Equation 2, k' indicates a proportional coefficient determined by the structure and physical characteristics of the driving transistor DT, Vth indicates a threshold voltage of the driving transistor DT, ELVDD indicates a first driving voltage of the first driving voltage line VDDL, and Vdata indicates a data voltage. The gate voltage of the driving transistor DT is (Vdata+Vth), and the voltage of the first electrode of the driving transistor DT is ELVDD. If Equation 2 is summarized, Equation 3 may be derived.

$$Ids = k' \times (ELVDD - Vdata)^2 \qquad \text{Equation 3}$$

Consequently, as shown in Equation 3, the driving current Ids may not depend on the threshold voltage Vth of the driving transistor DT. In other words, the threshold voltage Vth of the driving transistor DT may be compensated.

Figure 8:
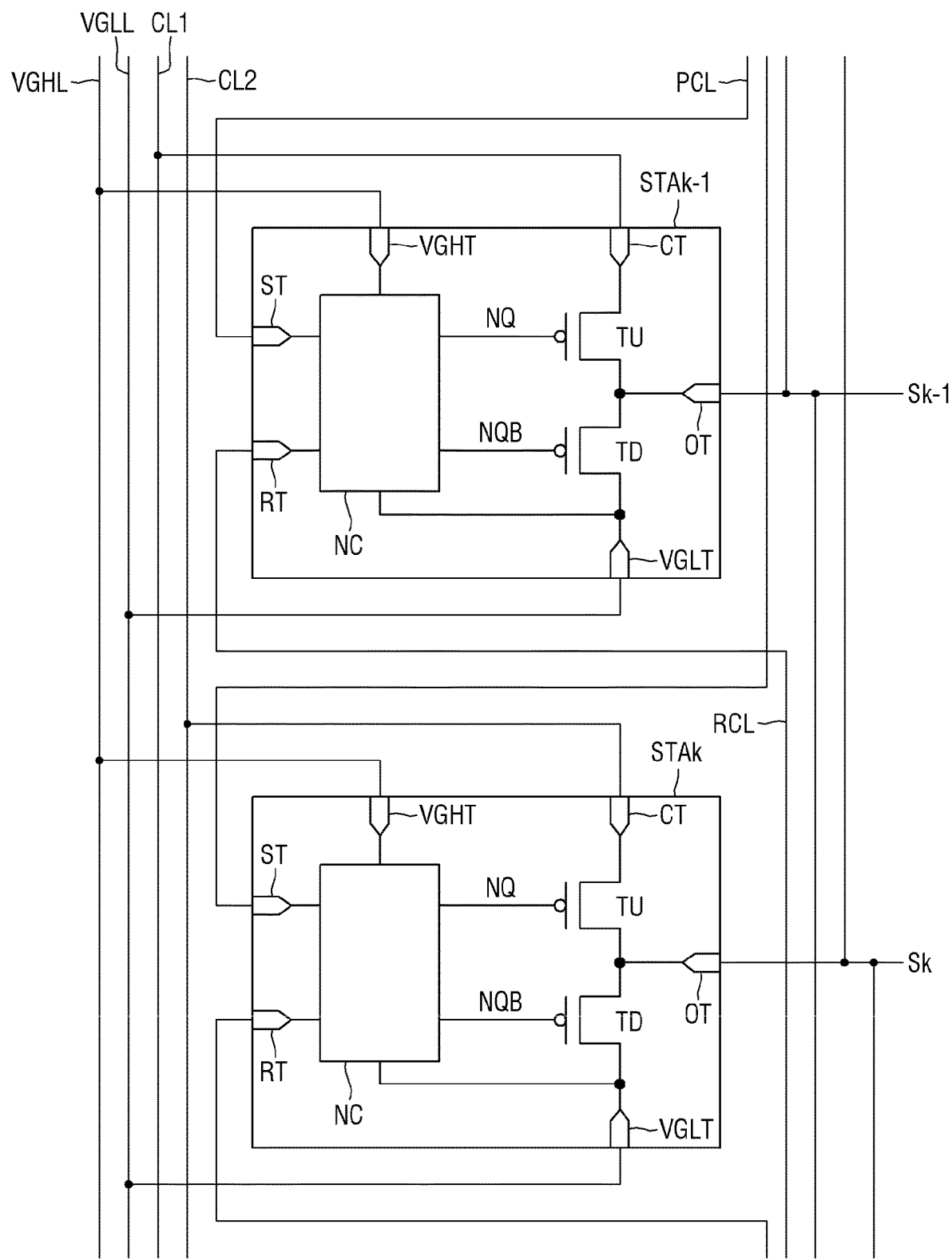
FIG. 8 is a diagram showing scan stages of the scan driver of FIG. 4.

FIG. 8 is a diagram showing scan stages of the scan driver of FIG. 4.

Referring to FIG. 8, the first scan driver 110 may include stages STAk−1 and STAk that are connected to each other in a dependent manner, and the stages STAk−1 and STAk may be connected to the scan lines Sk−1 and Sk to output (e.g., to sequentially output) scan signals. For example, a k−1th stage STAk−1 may be connected to the k−1th scan line Sk−1 to output a k−1th scan signal SCANk−1. A kth stage STAk may be connected to the kth scan line Sk to output a kth scan signal SCANk.

As shown in FIG. 8, each of the stages STAk−1 and STAk includes a pull-up transistor TU, a pull-down transistor TD, and a node controller NC. The pull-up transistor TD may be turned on when a pull-up node NQ has a gate-on voltage. The pull-down transistor TD may be turned on when a pull-down node NQB has a gate on voltage. The node controller NC may control a charge-discharge of the pull-up node NQ and the pull-down node NQB.

The node controller NC includes a start terminal ST, a reset terminal RT, a gate-on voltage terminal VGHT, a gate-off voltage terminal VGLT, a clock terminal CT, and an output terminal OT.

The start terminal ST may be connected to a front carry line PCL to which a start signal or an output signal of a front stage is applied. The reset terminal RT may be connected to a rear carry line RCL to which an output signal of a rear stage is input. The gate-on voltage terminal VGHT may be connected to a gate-on voltage line VGHL to which a gate-on voltage is applied. The gate-off voltage terminal VGLT may be connected to a gate-off voltage line VGLL to which a gate-off voltage is applied. The gate-on voltage may be the first level voltage V1, and the gate-off voltage may be the second level voltage V2.

The clock terminal CT may be connected to any suitable one of a first clock line CL1 to which a first clock signal is applied, and a second clock line CL2 to which a second clock signal is applied. For example, the stages STAk−1 and STAk may be alternately connected to the first clock line CL1 and the second clock line CL2. In this case, when the clock terminal CT of the k−1th stage STAk−1 is connected to the first clock line CL1, the clock terminal CT of the kth stage STAk may be connected to the second clock line CL2.

The output terminal OT may be connected to any suitable one of the scan lines Sk−1 and Sk. For example, the stages STAk−1 and STAk may be sequentially connected to the scan lines Sk−1 and Sk. In this case, for example, the output terminal OT of the k−1th stage STAk−1 may be connected to the k−1th scan line Sk−1, and the output terminal OT of the kth stage STAk may be connected to the kth scan line Sk.

The node controller NC controls the charge-discharge of the pull-up node NQ and the pull-down node NQB according to the start signal input to the start terminal ST or the output signal of the front stage. In order to stably control the output of the stage STA, the node controller NC allows the pull-down node NQB to have a gate-off voltage when the pull-up node NQ has a gate-on voltage, and allows the pull-up node NQ to have a gate-off voltage when the pull-down node (NQB) has a gate-on voltage. Accordingly, the node controller NC may include a plurality of transistors.

The pull-up transistor TU is turned on when the pull-up node NQ has a gate-on voltage to output a clock signal input to the clock terminal CT to the output terminal OT. The pull-down transistor TD is turned on when the pull-down node NQB has a gate-on voltage to output the gate-off voltage of the gate-off voltage terminal VGLT to the output terminal OT.

In each of the stages STAk−1 and STAk, the pull-up transistor TU, the pull-down transistor TD, and the plurality of transistors of the node controller NC may be formed as thin film transistors. For example, in an embodiment, as shown in FIG. 8, the pull-up transistor TU, the pull-down transistor TD, and the plurality of transistors of the node controller NC of the stage STA (e.g., STAK-1 and STAk) may be formed as P-type semiconductor transistors having P-type semiconductor characteristics. However, the present invention is not limited thereto. For example, in another embodiment, the pull-up transistor TU, the pull-down transistor TD, and the plurality of transistors of the node controller NC of the stage STA (e.g., STAK-1 and STAk) may be formed as N-type semiconductor transistors having N-type semiconductor characteristics.

Scan stages of the second scan driver 120 may be the same or substantially the same as the stages STAk−1 and STAk described with reference to FIG. 8, and thus, redundant description of the scan stages of the second scan driver 120 may not be repeated.

Figure 9:
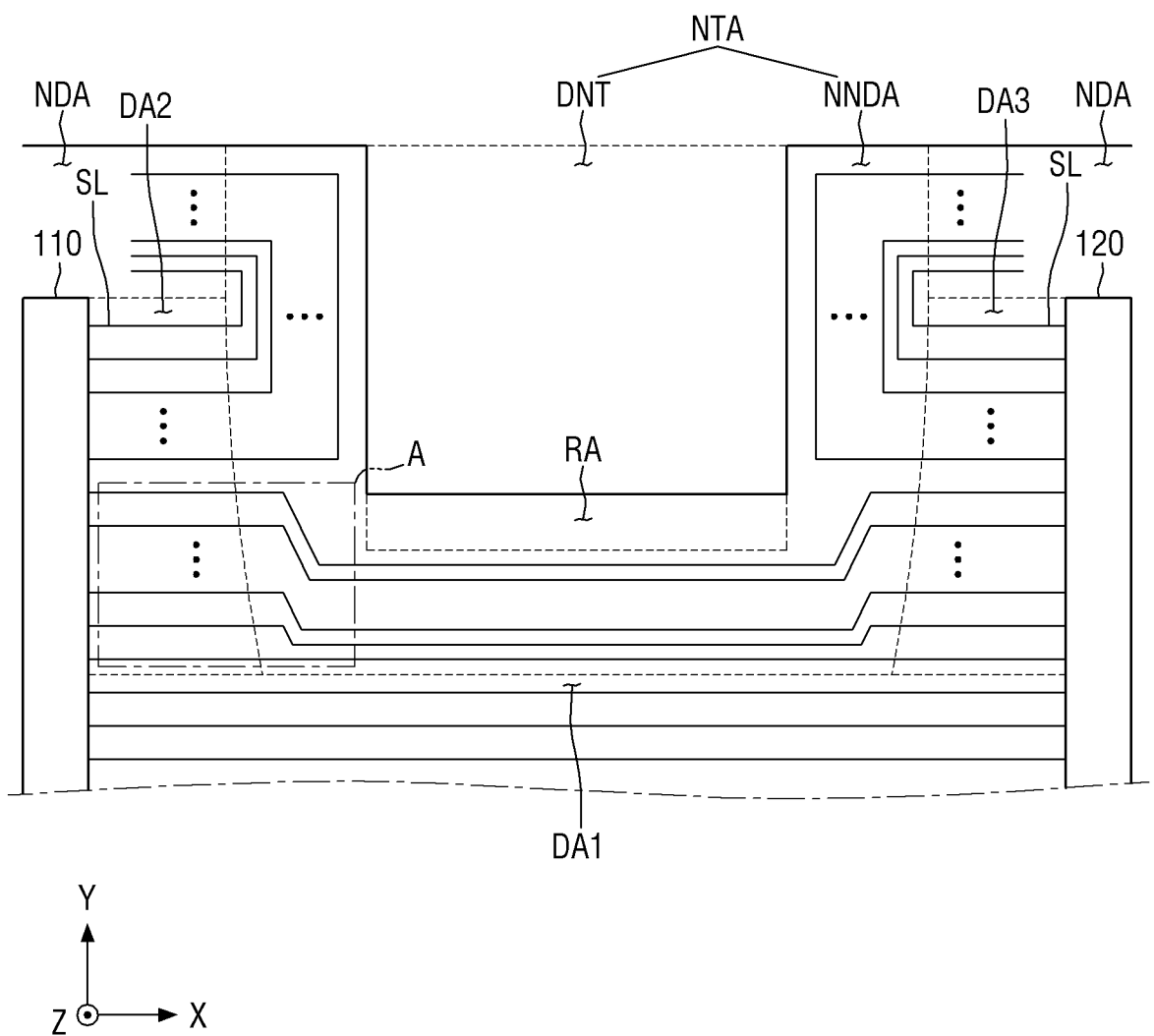
FIG. 9 is a plan view showing scan lines of a part of the first display area, the second display area, the third display area, and the display notch area of FIG. 4.

FIG. 9 is a plan view showing scan lines of a part of the first display area, the second display area, the third display area, and the display notch area of FIG. 4.

Referring to FIG. 9, the first scan driver 110 may be disposed at the left side of the first display area DA1 and the left side of the second display area DA2, and the second scan driver 120 may be disposed at the right side of the first display area DA1 and the right side of the third display area DA3.

The first scan driver 110 may be connected to the scan lines SL disposed at (e.g., in or on) the first display area DA1 and the second display area DA2. The second scan driver 120 may be connected to the scan lines SL disposed at (e.g., in or on) the first display area DA1 and the third display area DA3.

The scan lines SL of the first display area DA1 may be connected to both the first scan driver 110 and the second scan driver 120. For example, in an embodiment, each of the scan lines SL of the first display area DA1 may be connected to both the first scan driver 110 and the second scan driver 120. In another embodiment, some of the scan lines SL of the first display area DA1 may be connected to the first scan driver 110, and others of the scan lines SL of the first display area DA1 may be connected to the second scan driver 120.

The scan lines SL of the second display area DA2 may extend to a notch area NTA. Among the scan lines SL of the second display area DA2, the scan lines SL disposed at the upper side of the second display area DA2 may be bent in the notch non-display area NNDA to extend to the non-display area NDA disposed outside the upper side of the notch non-display area NNDA, and may be bent in the non-display area NDA disposed outside the upper side of the notch non-display area NNDA to extend to the non-display area NDA disposed outside the upper side of the second display area DA2.

The scan lines SL of the third display area DA3 may extend to the notch non-display area NNDA. Among the scan lines SL of the third display area DA3, the scan lines SL disposed at the upper side of the third display area DA3 may be bent in the notch non-display area NNDA to extend to the non-display area NDA disposed outside the upper side of the notch non-display area NNDA, and may be bent in the non-display area NDA disposed outside the upper side of the notch non-display area NNDA to extend to the non-display area NDA disposed outside the upper side of the third display area DA3.

Among the scan lines SL of the second display area DA2, the scan lines SL disposed at the lower side of the second display area DA2 may be electrically separated from the scan lines SL disposed at the lower side of the third display area DA3 from among the scan lines SL of the third display area DA3. In other words, the scan lines SL disposed at the lower side of the second display area DA2 may be spaced apart from the scan lines SL disposed at the lower side of the third display area DA3.

The interval between the scan lines SL in the notch non-display area NNDA may be smaller than the interval between the scan lines SL in the second display area DA2. Further, the interval between the scan lines SL in the notch non-display area NNDA may be smaller than the interval between the scan lines SL in the third display area DA3. Thus, the notch non-display area NNDA may be provided with a residual space RA, which may be an area other than the area at (e.g., in or on) which the scan lines SL are arranged, and dummy pixels may be arranged at (e.g., in or on) the residual space RA.

Because the length of the first display area DA1 in the first direction (e.g., the X-axis direction) may be greater than the length of the second display area DA2 in the first direction (e.g., the X-axis direction), the number of pixels PX arranged in the first direction (e.g., the X-axis direction) at (e.g., in or on) the first display area DA1 may be greater than the number of pixels PX arranged in the first direction (e.g., the X-axis direction) at (e.g., in or on) the second display area DA2. Thus, the number of pixels PX connected to the scan line SL of the first display area DA1 may be greater than the number of pixels PX connected to the scan line SL of the second display area DA2. Therefore, the load of the scan line SL of the first display area DA1 may be greater than the load of the scan line SL of the second display area DA2. Accordingly, compensation capacitors for compensating for a difference between the load of the scan line SL of the first display area DA1 and the load of the scan line SL of the second display area DA2 may be arranged at (e.g., in or on) the notch area NTA. The load of the scan line SL may indicate the RC delay of the scan line SL.

Figure 10:
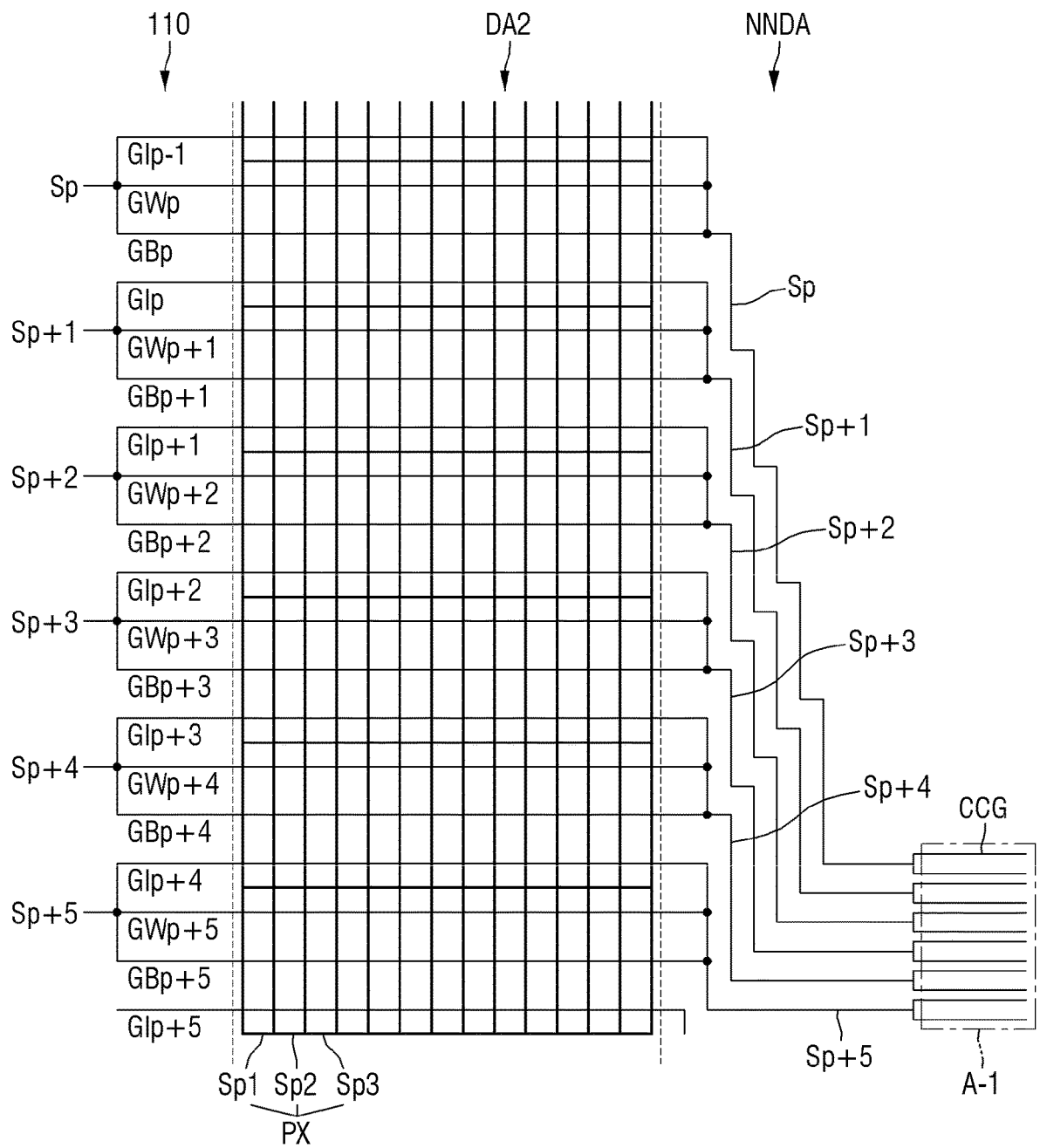
FIG. 10 is a detailed enlarged plan view of the area A of FIG. 9.

FIG. 10 is a detailed enlarged plan view of the area A of FIG. 9.

For convenience, FIG. 10 illustrates p−1th to p+5th gate initialization lines GIp−1 to GIp+5, pth to p+5th write signals GWp to GWp+5, and pth to p+5th anode initialization signals GBp to GBp+5 arranged at (e.g., in or on) the first display area DA1, the second display area DA2, and the notch non-display area NNDA.

Referring to FIG. 10, the p−1th to p+5th gate initialization lines GIp−1 to GIp+5, the pth to p+5th write signals GWp to GWp+5, and the pth to p+5th anode initialization signals GBp to GBp+5 may extend in the first direction (e.g., the X-axis direction). The p−1th to p+5th gate initialization lines GIp−1 to GIp+5, the pth to p+5th write signals GWp to GWp+5, and the pth to p+5th anode initialization signals GBp to GBp+5 may be respectively arranged to cross the pixels PX arranged in the first direction (e.g., the X-axis direction), and may be connected to the pixels PX arranged in the first direction (e.g., the X-axis direction).

Any one of the p−1th to p+5th gate initialization lines GIp−1 to GIp+5, any one of the pth to p+5th write signals GWp to GWp+5, and any one of the pth to p+5th anode initialization signals GBp to GBp+5 may be arranged to cross the same pixel PX, and may be connected to the same pixel PX. For example, the pth gate initialization line GIp, the pth write signal GWp, and the pth anode initialization signals GBp may be arranged to cross the same pixel PX, and may be connected to the same pixel PX.

Any one of the p−1th to p+5th gate initialization lines GIp−1 to GIp+5, any one of the pth to p+5th write signals GWp to GWp+5, and any one of the pth to p+5th anode initialization signals GBp to GBp+5 may be connected to each other at (e.g., in or on) the first scan driver 110 and the notch non-display area NNDA. For example, the pth gate initialization line GIp, the pth write signal GWp, and the pth anode initialization signals GBp may be connected to each other at (e.g., in or on) the first scan driver 110 and the notch non-display area NNDA. The line through which the pth gate initialization line GIp, the pth write signal GWp, and the pth anode initialization signals GBp are connected to each other may be defined as the pth scan line Sp.

In the notch non-display area NNDA, the scan lines Sp to Sp+5 may be connected to the compensation capacitors of a compensation capacitor group CCG. The number of compensation capacitors in the compensation capacitor group CCG may be changed depending on the number of the scan lines Sp to Sp+5.

Figure 11:
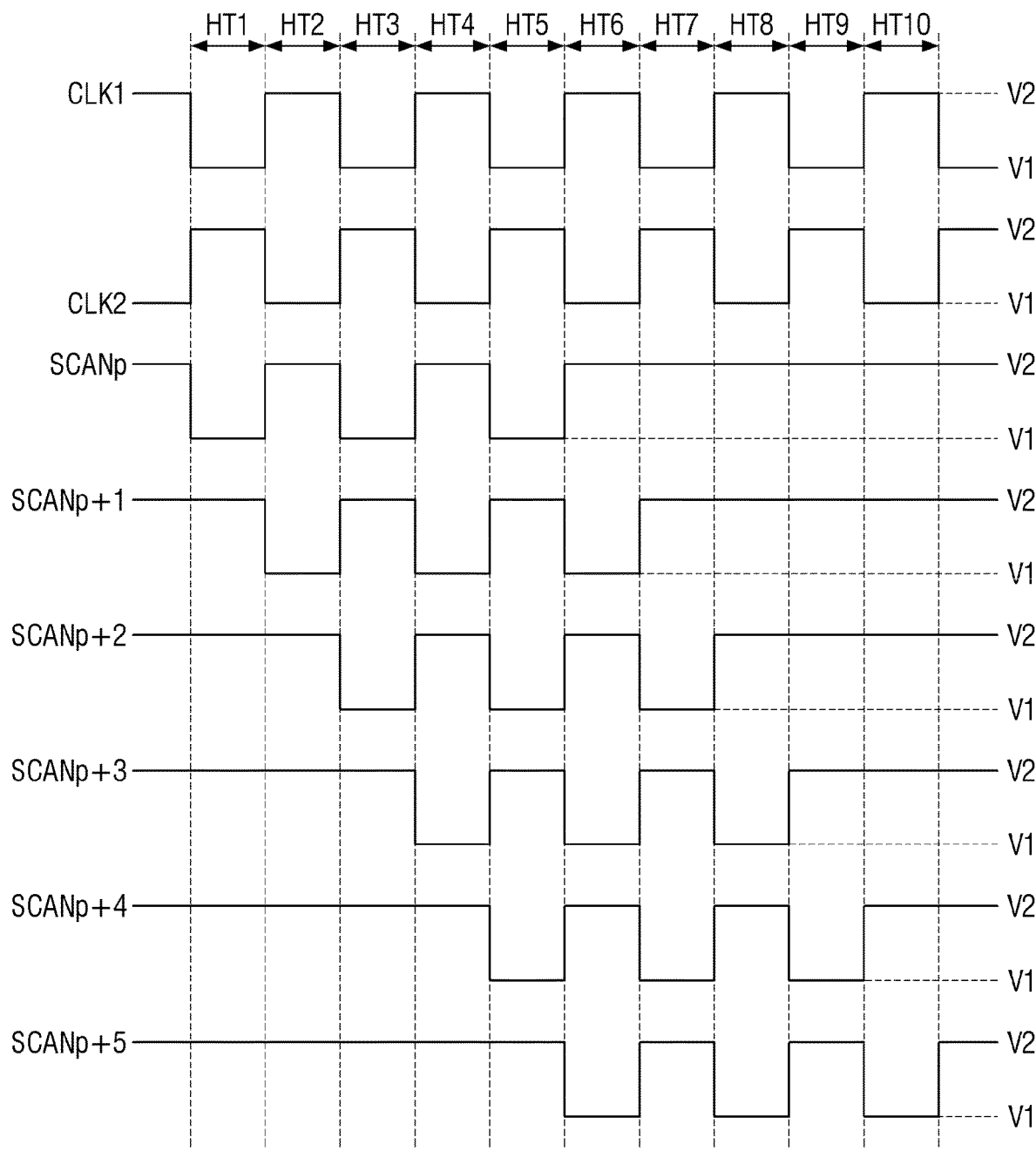
FIG. 11 is a waveform diagram showing pth to p+5th scan signals output by a first clock signal and a second clock signal.

FIG. 11 is a waveform diagram showing pth to p+5th scan signals output by a first clock signal and a second clock signal.

Referring to FIG. 11, each of the first clock signal CLK1 and the second clock signal CLK2 may be a signal for repeating the first level voltage V1 and the second level voltage V2 at a suitable period (e.g., a predetermine period). The second level voltage V2 may be higher than (e.g., greater than) the first level voltage V1. In FIG. 11, each of first to tenth horizontal periods HT1 to HT10 may correspond to (e.g., may define or may be) one horizontal period. In this case, the suitable period (e.g., the predetermined period) may be two horizontal periods 2H. Each of the first clock signal CLK1 and the second clock signal CLK2 may have the first level voltage V1 during one period 1H from among the two periods 2H, and may have the second level voltage V2 during the other period 1H from among the two periods 2H.

The phase of the first clock signal CLK1 may be opposite to the phase of the second clock signal CLK2. For example, when the first clock signal CLK1 has the first level voltage V1, the second clock signal CLK2 may have the second level voltage V2. Further, when the first clock signal CLK1 has the second level voltage V2, the second clock signal CLK2 may have the first level voltage V1.

The pth scan signal SCANp may include a p−1th gate initialization signal GISp−1, a pth write signal GWSp, and a pth anode initialization signal GBSp. The (p+1)th scan signal SCANp+1 may include a pth gate initialization signal GISp, a (p+1)th write signal GWSp+1, and a (p+1)th anode initialization signal GBSp+1. The (p+2)th scan signal SCANp+2 may include a (p+1)th gate initialization signal GISp+1, a (p+2)th write signal GWSp+2, a (p+2)th anode initialization signal GBSp+2. The (p+3th) scan signal SCANp+3 may include a (p+2)th gate initialization signal GISp+2, a (p+3)th write signal GWSp+3, a (p+3)th anode initialization signal GBSp+3. The (p+4)th scan signal SCANp+4 may include and a (p+3)th gate initialization signal GISp+3, a (p+4)th write signal GWSp+4, a (p+4)th anode initialization signal GBSp+4. The (p+5)th scan signal SCANp+5 may include a (p+4)th gate initialization signal GISp+4, a (p+5)th write signal GWSp+5, a (p+5)th anode initialization signal GBSp+5. The (p+6)th scan signal SCANp+6 may include a (p+5)th gate initialization signal GISp+5, a (p+6)th write signal GWSp+6, a (p+6)th anode initialization signal GBSp+6.

The first clock signal CLK1 may be output as the pth scan signal SCANp during the first to fifth horizontal periods HT1 to HT5. The second clock signal CLK2 may be output as the (p+1)th scan signal SCANp+1 during the second to sixth horizontal periods HT2 to HT6. The first clock signal CLK1 may be output as the (p+2)th scan signal SCANp+2 during the third to seventh horizontal periods HT3 to HT7. The second clock signal CLK2 may be output as the (p+3)th scan signal SCANp+3 during the fourth to eighth horizontal periods HT4 to HT8. The first clock signal CLK1 may be output as the (p+4)th scan signal SCANp+4 during the fifth to ninth horizontal periods HT5 to HT9. The second clock signal CLK2 may be output as the (p+5)th scan signal SCANp+5 during the sixth to tenth horizontal periods HT6 to HT10.

The first clock signal CLK1 of the fifth horizontal period HT5 may be output as the pth scan signal SCANp, the (p+2)th scan signal SCANp+2, and the (p+4)th scan signal SCANp+4. In other words, when each of the scan signals includes q (where q is a positive integer) pulses, the first clock signal CLK1 may be output as q odd scan signals. For example, when each of the scan signals includes three pulses as shown in FIG. 11, the first clock signal CLK1 may be output as three odd scan signals. Therefore, the first clock signal CLK1 may be influenced by the load of q scan lines.

For example, the load of the q scan lines influencing the first clock signal CLK1 may be defined as Equation 4.

$$TLOAD = Sp\_LOAD + CCGp\_LOAD + Sp+2\_LOAD + CCGp+2\_LOAD + Sp+4\_LOAD + CCGp+4\_LOAD \quad \text{Equation 4}$$

In Equation 4, TLOAD indicates a load of q scan lines influencing the first clock signal CLK1, Sp_LOAD indicates a load between the pth scan line and the pixels PX, and CCGp_LOAD indicates a load of compensation capacitors of the compensation capacitor group CCG connected to the pth scan line.

In Equation 4, because the pth scan line Sp includes the p−1th gate initialization line GIp−1, the pth write signal line GWp, and the pth anode initialization line GBp, the load Sp_LOAD between the pth scan line and the pixels PX may include a load GWp_LOAD between the pth write signal line GWp and the pixels PX, a load GWp_LOAD between the pth anode initialization line GBp and the pixels PX, and a load GIp−1_LOAD between the p−1th gate initialization line GIp−1 and the pixels PX. Therefore, Equation 4 may be defined as Equation 5.

Equation 5

$$TLOAD = GWp\_LOAD + GBp\_LOAD + GIp-1\_LOAD + $$
$$CCGp\_LOAD + GWp+2\_LOAD + GBp+2\_LOAD + $$
$$GIp+1\_LOAD + CCGp+2\_LOAD + GWp+4\_LOAD + $$
$$GBp+4\_LOAD + GIp+3\_LOAD + CCGp+4\_LOAD$$

Further, the second clock signal CLK2 of the sixth horizontal period HT6 may be output as the (p+1)th scan signal SCANp+1, the (p+3)th scan signal SCANp+3, and the (p+5)th scan signal SCANp+5. In other words, when each of the scan signals includes q (where q is a positive integer) pulses, the second clock signal CLK2 may be output as q even scan signals. For example, when each of the scan signals includes three pulses as shown in FIG. 11, the second clock signal CLK2 may be output as three even scan signals. In this case, the second clock signal CLK2 may be influenced by the load of q scan lines.

As shown in FIG. 11, each of the first clock signal CLK1 and the second clock signal CLK2 for generating the scan signals SCANp to SCANp+5 is influenced by the load of q scan lines. Therefore, it may be desired to design a load of the compensation capacitor groups CCG in consideration of the load of the q scan lines.

Figure 12:
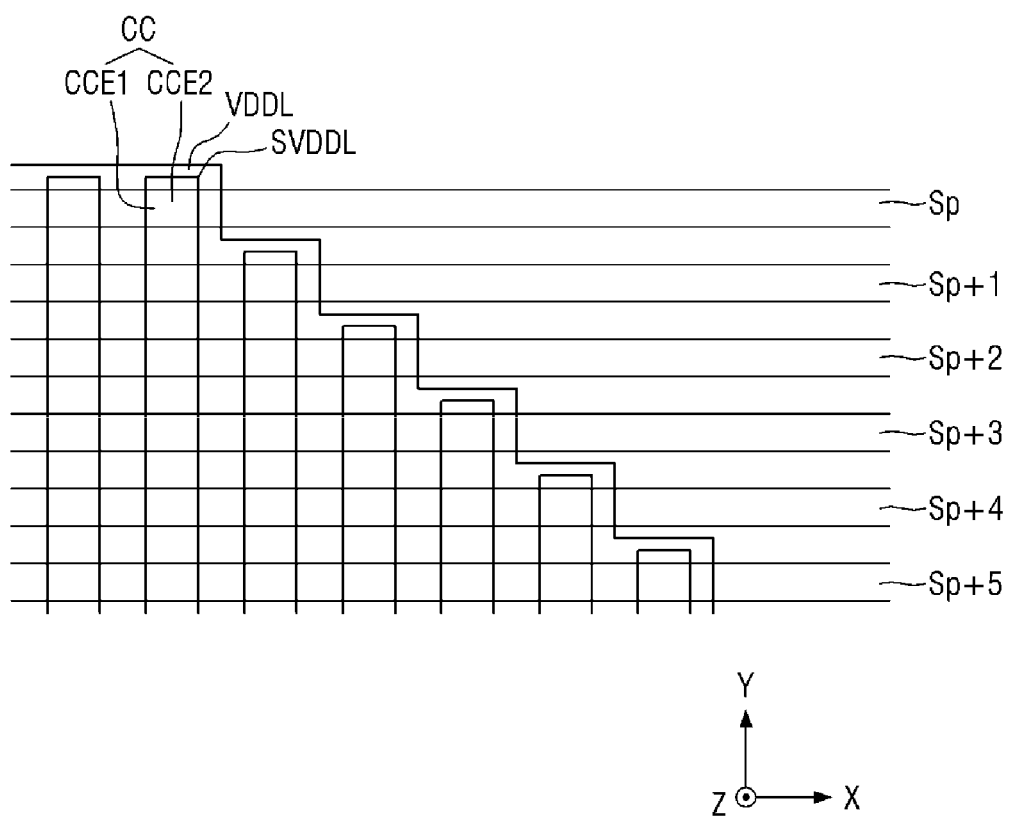
FIG. 12 is a detailed enlarged plan view showing an example of compensation capacitors in the area A-1 of FIG. 10.

FIG. 12 is a detailed enlarged plan view showing an example of compensation capacitors in the area A-1 of FIG. 10.

FIG. 12 shows compensation capacitors CC of the compensation capacitor groups CCG connected to the pth to p+5th scan lines Sp to Sp+5.

Referring to FIG. 12, each of the compensation capacitor groups CCG may include a plurality of compensation capacitors CC. Each of the compensation capacitors CC may include a first electrode CCE1 and a second electrode CCE2. The first electrode CCE1 of the compensation capacitor CC may be a portion of any suitable one of the scan lines Sp to Sp+5 overlapping with a sub-driving voltage line SVDDL in the third direction (e.g., the Z-axis direction). The second electrode CCE2 of the compensation capacitor CC may be a portion of the sub-driving voltage line SVDDL overlapping with any suitable one of the scan lines Sp to Sp+5 in the third direction (e.g., the Z-axis direction).

A length of the first driving voltage line VDDL overlapping with the scan line in the third direction (e.g., the Z-axis direction) may decrease from the pth scan line Sp towards the p+5th scan line Sp+5. For example, the length of the first driving voltage line VDDL in the second direction (e.g., the Y-axis direction) may decrease in a step shape towards the first direction (e.g., the X-axis direction).

The sub-driving voltage line SVDDL may be electrically connected to the first driving voltage line VDDL. The sub-driving voltage line SVDDL may extend in the second direction (e.g., the Y-axis direction). The sub-driving voltage line SVDDL may cross the scan lines Sp to Sp+5. The sub-driving voltage line SVDDL may overlap with the first driving voltage line VDDL in the third direction (e.g., the Z-axis direction).

As shown in FIG. 12, the number of the capacitors CC included in the compensation capacitor group CCG may increase from the compensation capacitor group CCG connected to the pth scan line Sp towards the compensation capacitor group CCG connected to the p+5th scan line Sp+5. In other words, the number of compensation capacitors CC connected to a p+rth (where r is a positive integer) scan line Sp+r may be smaller than (e.g., may be less than) the number of compensation capacitors CC connected to a p+sth (where s is a positive integer greater than r) scan line Sp+s.

For example, the number of compensation capacitors connected to the (p+1)th scan line Sp+1 may be greater than the number of compensation capacitors connected to the pth scan line Sp. Further, the number of compensation capacitors connected to the (p+2)th scan line Sp+2 may be greater than the number of compensation capacitors connected to the p+1 scan line Sp+1.

Figure 13:
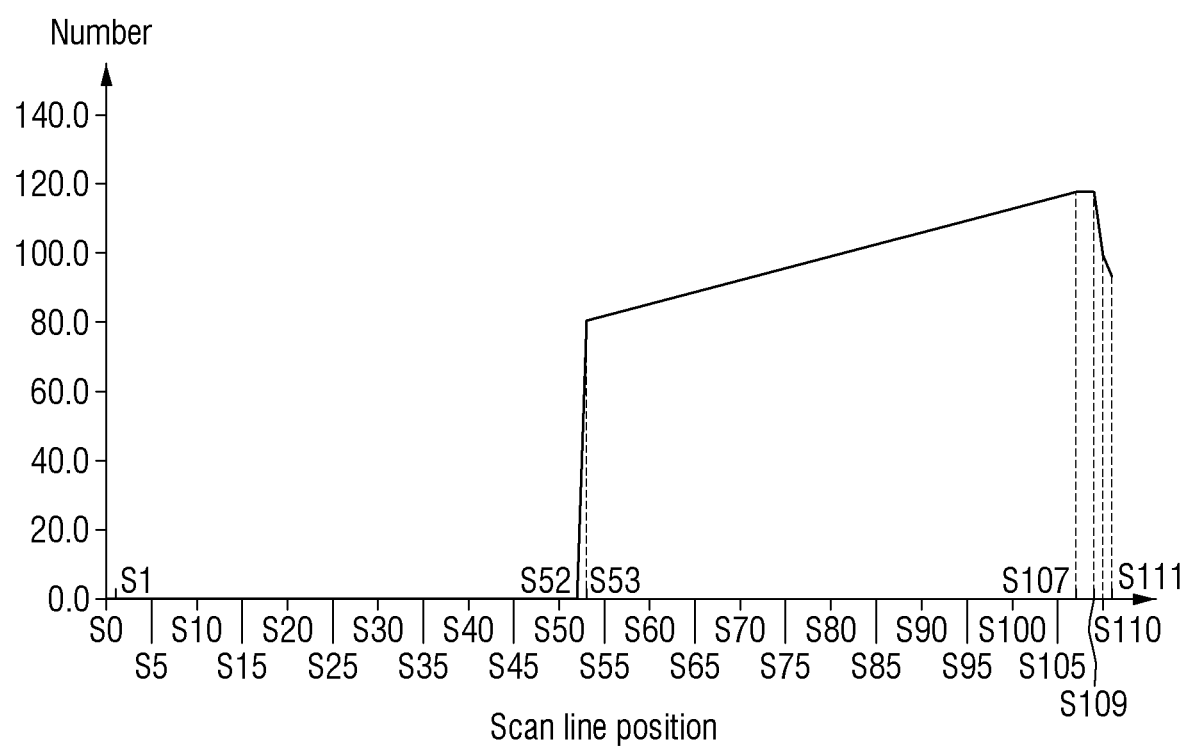
FIG. 13 is a graph showing the number of compensation capacitors connected to a scan line according to a position of the scan line according to an embodiment.
Figure 14:
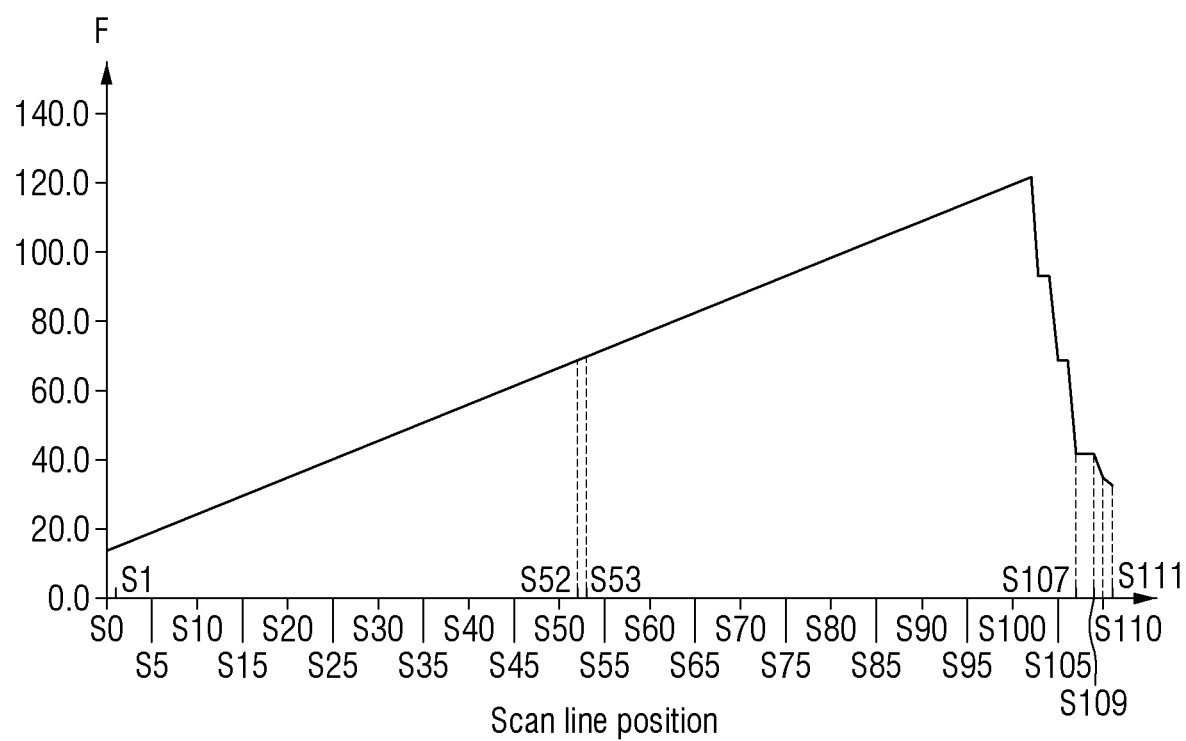
FIG. 14 is a graph showing the capacitance of q scan lines according to the position of the scan line according to an embodiment.

FIG. 13 is a graph showing the number of compensation capacitors connected to a scan line according to a position of the scan line, according to an embodiment, and FIG. 14 is a graph showing the capacitance of q scan lines according to the position of the scan line, according to an embodiment.

In FIG. 13, the X-axis indicates the position of the scan line at (e.g., in or on) the second display area DA2, and the Y-axis indicates the number of compensation capacitors. In FIG. 14, the X-axis indicates the position of the scan line at (e.g., in or on) the second display area DA2, and the Y-axis indicates the capacitance of the q scan lines, in which the unit of capacitance may be Farad (F). In FIGS. 13 and 14, the scan line disposed at the uppermost side of the second display area DA2 is defined as "S1", the scan line disposed at the lowermost side of the second display area DA2 is defined as "S111", and the position of the scan line increases from the upper side of the second display area DA2 toward the lower side of the second display area DA2.

Referring to FIG. 13, the compensation capacitors CC may not be connected to the scan line from the upper side of the second display area DA2 to the center of the second display area DA2. For example, the number of compensation capacitors CC from a first scan line S1 of the second display area DA2 to a 52nd scan line S52 may be 0.

The number of compensation capacitors CC connected to the scan line may increase from the center of the second display area DA2 towards the lower side of the second display area DA2. For example, the number of compensation capacitors CC connected to the scan line may linearly increase from a 53rd scan line S53 of the second display area DA2 towards a 107th scan line S107. In this case, the capacitance of the scan line may increase from the 53rd scan line S53 of the second display area DA2 towards the 107th scan line S107.

The number of compensation capacitors CC connected to the scan line from the 107th scan line S107 of the second display area to the 109th scan line S109 of the second display area DA2 may be the same or substantially the same. In this case, the capacitance of the scan line from the 107th scan line S107 of the second display area to the 109th scan line S109 of the second display area DA2 may be the same or substantially the same Further, the number of compensation capacitors CC connected to the 110th scan line S110 of the second display area DA2 may be smaller than (e.g., less than) the number of compensation capacitors CC connected to the 109th scan line S110. Further, the number of compensation capacitors CC connected to the 111th scan line S111 of the second display area DA2 may be smaller than (e.g., may be less than) the number of compensation capacitors CC connected to the 110th scan line S110. In this case, the capacitance of the scan line may decrease from the 109th scan line S109 of the second display area DA2 towards the 111th scan line S111.

Referring to FIG. 14, when the pth scan line is an odd scan line, the capacitance of q scan lines from the pth scan line indicates a capacitance of q continuous odd scan lines from the pth scan line. Further, when the pth scan line is an even scan line, the capacitance of q scan lines from the pth scan line indicates a capacitance of q continuous even scan lines from the pth scan line. Therefore, the capacitance of q scan lines may be defined as a capacitance of q odd scan lines or q even scan lines that are adjacent to each other. For example, the capacitance of q scan lines may be defined as a sum of a capacitance of the pth scan line, a capacitance of the (p+2)th scan line, and a capacitance of the (p+4)th scan line.

For example, the capacitance of three scan lines from the 102nd scan line S102 may be a sum of a capacitance of the 102nd scan line S102, a capacitance of the 104th scan line S104, and a capacitance of the 106th scan line S106. In another example, the capacitance of three scan lines from the 103rd scan line S103 may be a sum of a capacitance of the 103rd scan line S103, a capacitance of the 105th scan line S105, and a capacitance of the 107th scan line S107.

The capacitance of three scan lines from the 103rd scan line S103 may be smaller than (e.g., may be less than) the capacitance of three scan lines from the 102nd scan line S102. Further, the capacitance of three scan lines from the 104th scan line S104 may be greater than the capacitance of three scan lines from the 103rd scan line S103. Further, the capacitance of three scan lines from the 105th scan line S105 may be smaller than (e.g., may be less than) the capacitance of three scan lines from the 104th scan line S104. Further, the capacitance of three scan lines from the 106th scan line S106 may be greater than the capacitance of three scan lines from the 105th scan line S105.

A difference between an RC delay of the scan line disposed at the lower side of the second display area DA2 and an RC delay of the scan line disposed at the upper side of the first display area DA1 may be reduced or minimized, thereby reducing or minimizing a difference between a pulse width of the scan signal applied to the scan line disposed at the lower side of the second display area DA2 and a pulse width of the scan signal applied to the scan line disposed at the upper side of the first display area DA1. Accordingly, the occurrence of a difference between luminance of the pixels connected to the scan line disposed at the lower side of the second display area DA2 and luminance of the pixels connected to the scan line disposed at the upper side of the first display area DA1 may be prevented or substantially prevented.

In order to reduce or minimize the RC delay of the scan line disposed at the lower side of the second display area DA2 and the RC delay of the scan line disposed at the upper side of the first display area DA1, it may be desired that the load of q scan lines is designed to increase from the upper side of the second display area DA2 toward the lower side of the second display area DA2. However, as shown in FIG. 14, the capacitance of q scan lines may not increase from the 102th scan line S102 towards the 111th scan line S111. Therefore, the load of q scan lines may not increase from the 102th scan line S102 towards the 111th scan line S111.

Accordingly, as shown in FIG. 13, when the number of compensation capacitors CC connected to the scan line increases from the 53th scan line S53 of the second display area DA2 towards the 107th scan line S107 of the second display area DA2, the number of compensation capacitors CC connected to the scan line from the 107th scan line S107 towards the 109th scan line to S109 may be the same or substantially the same, and the number of compensation capacitors CC connected to the scan line may decrease from the 109th scan line S109 towards the 111th scan line S109. Thus, it may be difficult to reduce or minimize the RC delay of the scan line disposed at the lower side of the second display area DA2 and the RC delay of the scan line disposed at the upper side of the first display area DA1. Accordingly, an improved or an optimal design of the compensation capacitor CC for reducing or minimizing the RC delay of the scan line disposed at the lower side of the second display area DA2 and the RC delay of the scan line disposed at the upper side of the first display area DA1 may be desired.

Figure 15:
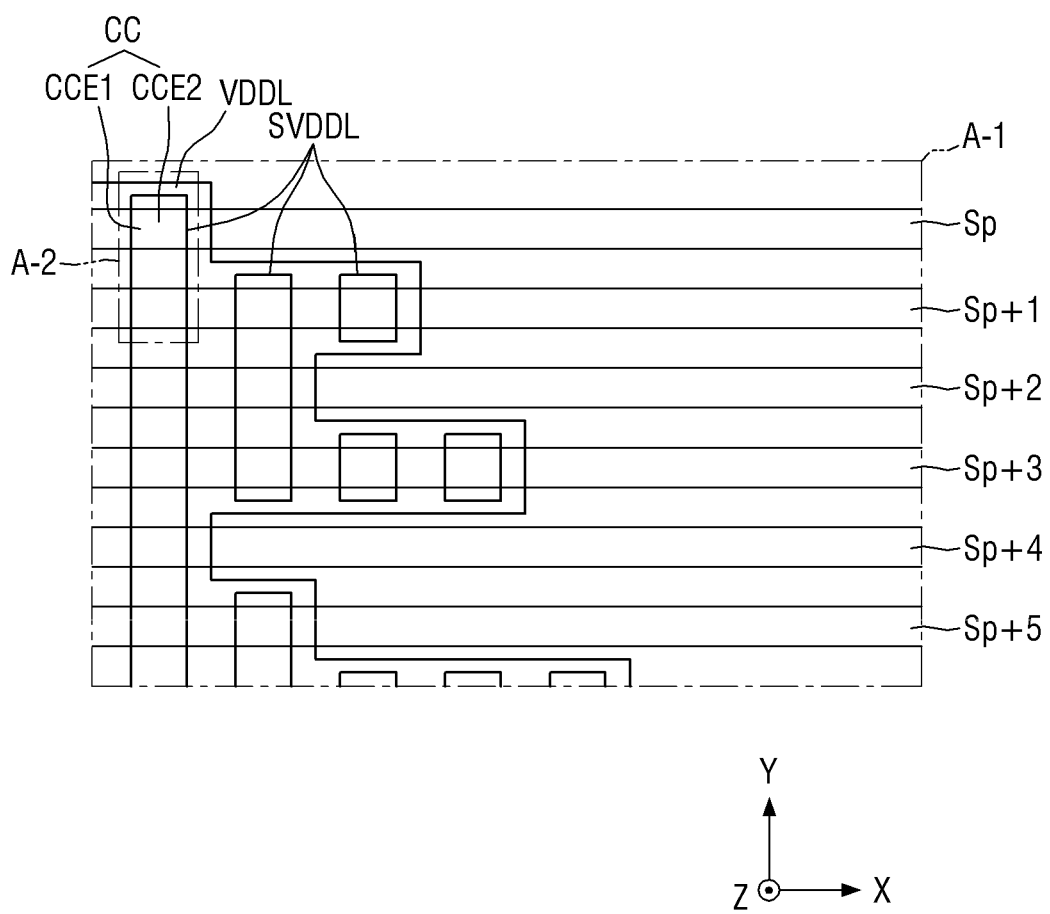
FIG. 15 is a detailed enlarged plan view showing another example of compensation capacitors in the area A-1 of FIG. 10.

FIG. 15 is a detailed enlarged plan view showing another example of compensation capacitors in the area A-1 of FIG. 10.

The embodiment shown in FIG. 15 may be different from the embodiment shown in FIG. 12 in that the number of compensation capacitors CC included in the compensation capacitor group CCG of FIG. 15 may not increase from the compensation capacitor group CCG connected to the pth scan line Sp towards the compensation capacitor group CCG connected to the p+5th scan line Sp+5.

Referring to FIG. 15, a length of the first driving voltage line VDDL overlapping with the scan line in the third direction (e.g., the Z-axis direction) may change from the pth scan line Sp towards the p+5th scan line Sp+5. For example, the length of the first driving voltage line VDDL overlapping with the scan line in the third direction (e.g., the Z-axis direction) may increase and/or may decrease from the pth scan line Sp towards the p+5th scan line Sp+5.

The number of compensation capacitors CC included in the compensation capacitor group CCG may increase and/or may decrease from the compensation capacitor group CCG connected to the pth scan line Sp towards the compensation capacitor group CCG connected to the p+5th scan line Sp+5. For example, the number of compensation capacitors CC connected to the (p+1)th scan line Sp+1 may be greater than the number of compensation capacitors CC connected to the pth scan line Sp. Further, the number of compensation capacitors CC connected to the (p+2)th scan line Sp+2 may be smaller than (e.g., less than) the number of compensation capacitors CC connected to the (p+1)th scan line Sp+1. Further, the number of compensation capacitors CC connected to the (p+3)th scan line Sp+3 may be greater than the number of compensation capacitors CC connected to the (p+2)th scan line Sp+2. Further, the number of compensation capacitors CC connected to the (p+4)th scan line Sp+4 may be smaller than (e.g., less than) the number of compensation capacitors CC connected to the (p+3)th scan line Sp+3. Further, the number of compensation capacitors CC connected to the (p+5)th scan line Sp+5 may be greater than the number of compensation capacitors CC connected to the (p+4)th scan line Sp+4.

A number difference between the compensation capacitors CC connected to scan lines adjacent to each other in the second direction (e.g., the Y-axis direction) may change (e.g., may vary) depending on the position of the scan line For example, a difference between the number of compensation capacitors CC connected to the (p+1)th scan line Sp+1 and the number of compensation capacitors CC connected to the pth scan line Sp may be different from a difference between the number of compensation capacitors CC connected to the (p+2)th scan line Sp+2 and the number of compensation capacitors CC connected to the (p+1)th scan line Sp+1.

Figure 16:
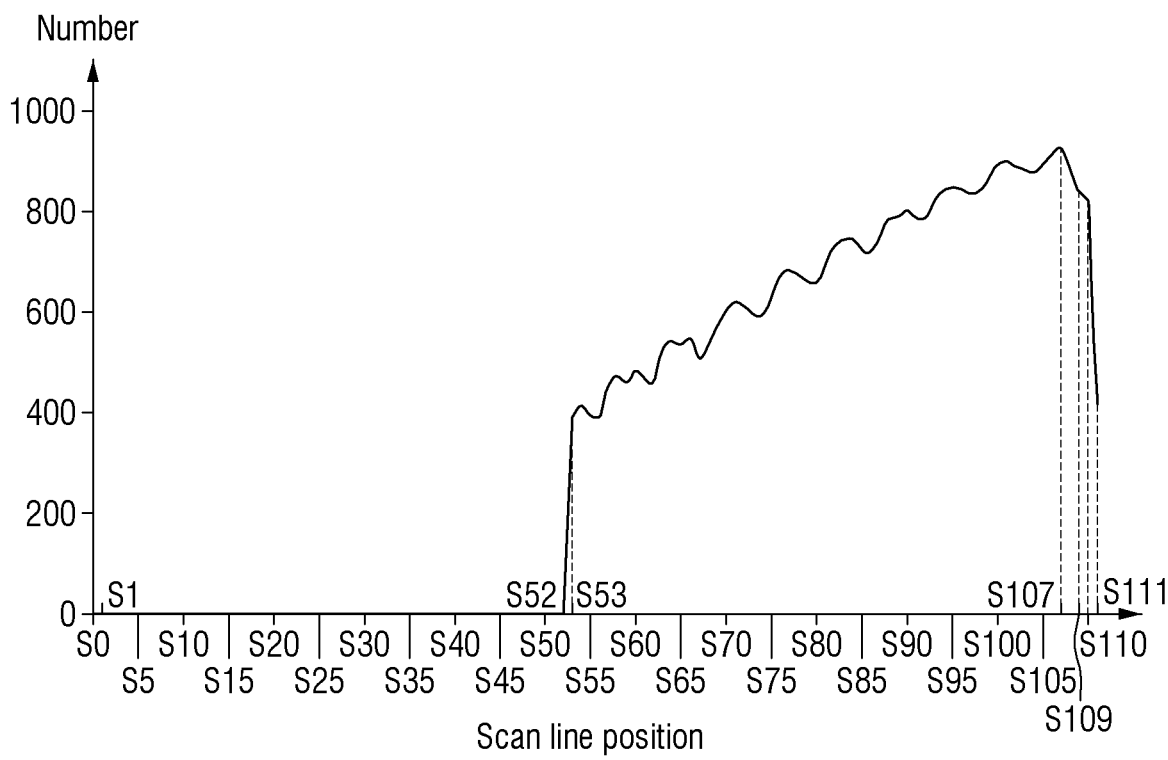
FIG. 16 is a graph showing the capacitance of q scan lines according to the position of the scan line according to another embodiment.
Figure 17:
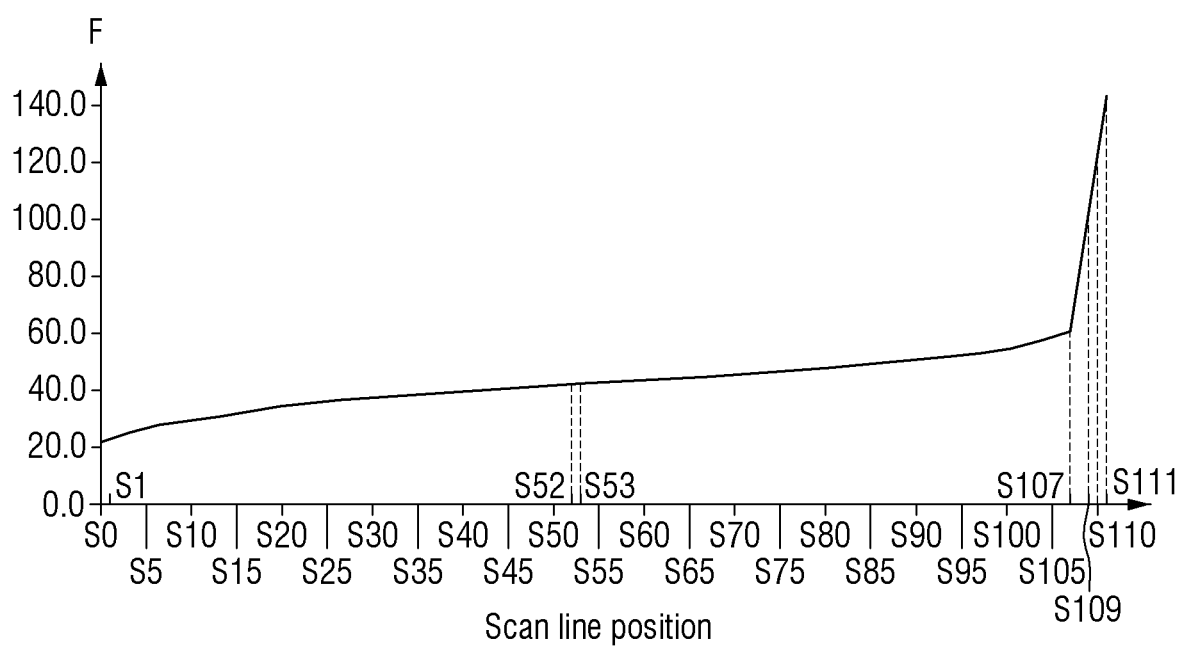
FIG. 17 is a graph showing the capacitance of q scan lines according to the position of the scan line according to still another embodiment.

FIG. 16 is a graph showing the capacitance of q scan lines according to the position of the scan line, according to another embodiment, and FIG. 17 is a graph showing the capacitance of q scan lines according to the position of the scan line, according to another embodiment.

In FIG. 16, the X-axis indicates the position of the scan line at (e.g., in or on) the second display area DA2, and the Y-axis indicates the number of compensation capacitors. In FIG. 17, the X-axis indicates the position of the scan line at (e.g., in or on) the second display area DA2, and the Y-axis indicates the capacitance of the q scan lines, in which the unit of the capacitance may be Farad (F). In FIGS. 16 and 17, the scan line disposed at the uppermost side of the second display area DA2 is defined as "S1", the scan line disposed at the lowermost side of the second display area DA2 is defined as "S111", and the position of the scan line increases from the upper side of the second display area DA2 towards the lower side of the second display area DA2.

Referring to FIG. 16, the compensation capacitors CC may not be connected to the scan line from the upper side of the second display area DA2 to the center of the second display area DA2. For example, the number of compensation capacitors CC from a first scan line S1 of the second display area DA2 to a 52nd scan line S52 may be 0.

The number of compensation capacitors CC connected to the scan line may increase and/or may decrease from the center of the second display area DA2 towards the lower side of the second display area DA2. For example, as shown in FIG. 15, the number of compensation capacitors CC connected to the scan line may increase, decrease, increase, and decrease for each scan line group including t (where t is a positive integer that is twice that of q) scan lines. For example, when the scan line group includes the pth to (p+5)th scan lines Sp to Sp+5, the number of compensation capacitors CC connected to the scan line may increase, decrease, increase, and decrease from the pth scan line Sp to the (p+4)th scan line Sp+4. In other words, the number of compensation capacitors CC connected to the (p+1)th scan line Sp+1 may be greater than the number of compensation capacitors CC connected to the pth scan line Sp. The number of compensation capacitors CC connected to the (p+2)th scan line Sp+2 may be smaller than (e.g., less than) the number of compensation capacitors CC connected to the (p+1)th scan line Sp+1. The number of compensation capacitors CC connected to the (p+3)th scan line Sp+3 may be greater than the number of compensation capacitors CC connected to the (p+2)th scan line Sp+2. The number of compensation capacitors CC connected to the (p+4)th scan line Sp+4 may be smaller than (e.g., less than) the number of compensation capacitors CC connected to the (p+3)th scan line Sp+3.

In FIG. 16, the number of compensation capacitors CC connected to the scan line in each of the first to ninth scan line groups SG1 to SG9 may increase, decrease, increase, and decrease. For example, the first scan line group SG1 may include the 57th to 62nd scan lines S57 to S62. In this case, the number of compensation capacitors CC connected to the 58th scan line S58 may be greater than the number of compensation capacitors CC connected to the 57th scan line S57. The number of compensation capacitors CC connected to the 59th scan line S59 may be smaller than (e.g., less than) the number of compensation capacitors CC connected to the 58th scan line S58. The number of compensation capacitors CC connected to the 60th scan line S60 may be greater than the number of compensation capacitors CC connected to the 59th scan line S59. The number of compensation capacitors CC connected to the 61st scan line S61 may be smaller than (e.g., less than) the number of compensation capacitors CC connected to the 60th scan line S60.

The number of compensation capacitors CC connected to the scan line may increase, decrease, and increase from the 105th scan line of the second display area DA2 to the 107th scan line of the second display area DA2. Further, the number of compensation capacitors CC connected to the scan line may decrease from the 108th scan line S108 of the second display area DA2 to the 111th scan line S111 of the second display area DA2.

Referring to FIG. 17, when the pth scan line is an odd scan line, the capacitance of q scan lines from the pth scan line indicates a capacitance of q continuous odd scan lines from the pth scan line. Further, when the pth scan line is an even scan line, the capacitance of q scan lines from the pth scan line indicates a capacitance of q continuous even scan lines from the pth scan line. Therefore, the capacitance of q scan lines may be defined as a capacitance of q odd or q even scan lines that are adjacent to each other. For example, the capacitance of q scan lines may be defined as a sum of a capacitance of the pth scan line, a capacitance of the (p+2)th scan line, and a capacitance of the (p+4)th scan line.

For example, the capacitance of three scan lines from the 102nd scan line S102 may be a sum of a capacitance of the 102nd scan line S102, a capacitance of the 104th scan line S104, and a capacitance of the 106th scan line S106. Further, the capacitance of three scan lines from the 103rd scan line S103 may be a sum of a capacitance of the 103rd scan line S103, a capacitance of the 105th scan line S105, and a capacitance of the 107th scan line S107. The capacitance of three scan lines from the 102nd scan line S102 may be smaller than (e.g., less than) the capacitance of three scan lines from the 103rd scan line S103.

The capacitance of three odd scan lines in the 101th to 111th scan lines S101 to S111 may increase. In other words, the capacitance of three odd scan lines from a p+rth scan line Sp+r may be smaller than (e.g., less than) the capacitance of three odd scan lines connected to a p+s scan line Sp+s.

As described above, the capacitance of q scan lines may increase from the upper side of the second display area DA2 towards the lower side of the second display area DA2. For example, the number of compensation capacitors CC connected to the scan line in the scan line group including t scan lines may be designed to increase, decrease, increase, and decrease. Thus, the load of q scan lines may increase from the upper side of the second display area DA2 towards the lower side of the second display area DA2. Therefore, a difference between an RC delay of the scan line disposed at the lower side of the second display area DA2 and an RC delay of the scan line disposed at the upper side of the first display area DA1 may be reduced or minimized. Thus, a difference between a pulse width of the scan signal applied to the scan line disposed at the lower side of the second display area DA2 and a pulse width of the scan signal applied to the scan line disposed at the upper side of the first display area DA1 may be reduced or minimized. Accordingly, due to the pulse width of the scan signal, the occurrence of a difference between luminance of the pixels connected to the scan line disposed at the lower side of the second display area DA2 and luminance of the pixels connected to the scan line disposed at the upper side of the first display area DA1 may be prevented or substantially prevented.

Figure 18:
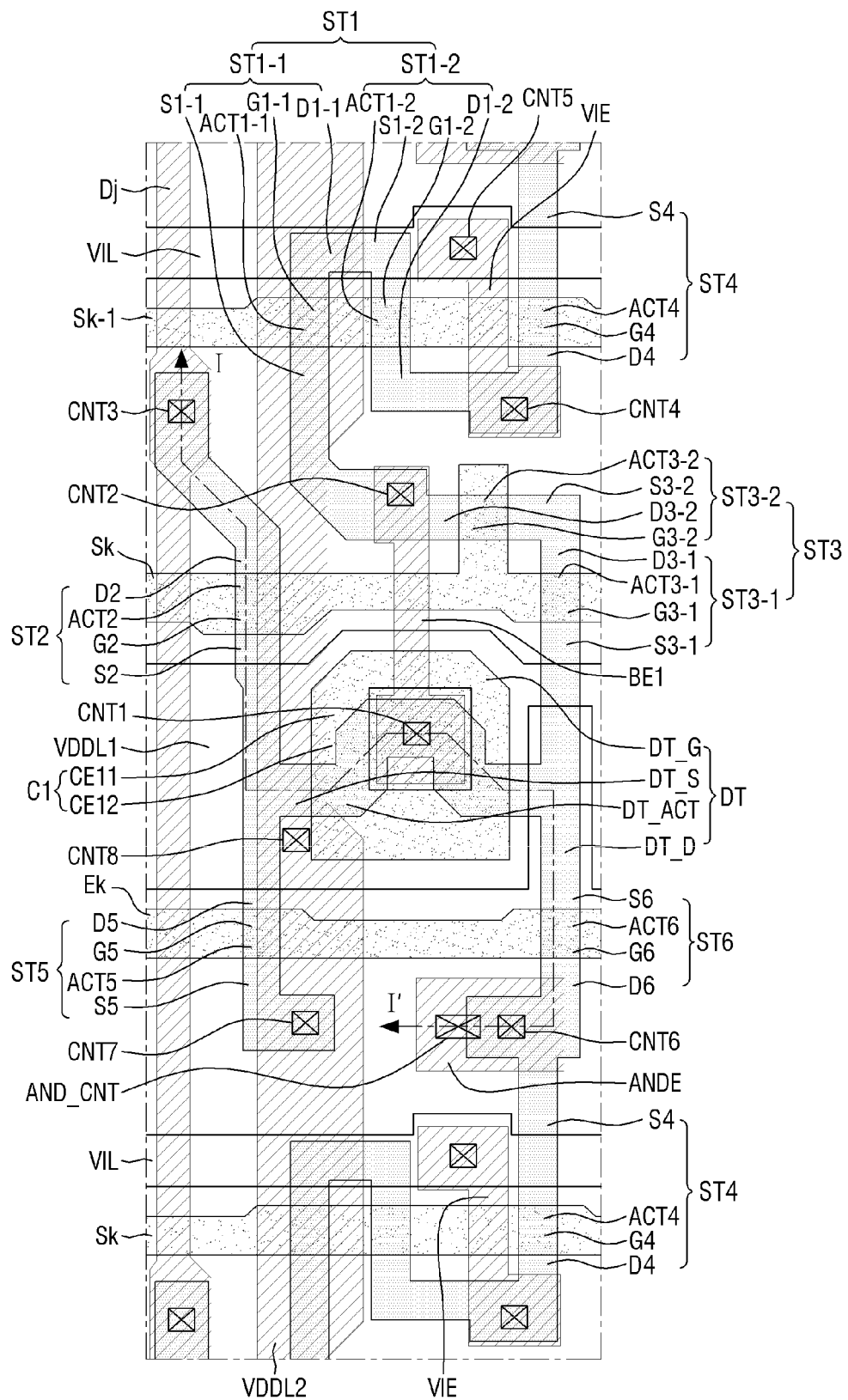
FIG. 18 is a detailed enlarged plan view illustrating an example of the pixel of FIG. 10.

FIG. 18 is a detailed enlarged plan view illustrating an example of the pixel of FIG. 10.

Referring to FIG. 18, a pixel PX may include a driving transistor DT, first to sixth transistors ST1 to ST6, and a capacitor C1.

The driving transistor DT may include an active layer DT_ACT, a gate electrode DT_G, a first electrode DT_S, and a second electrode DT_D. The active layer DT_ACT of the driving transistor DT may overlap with the gate electrode DT_G of the driving transistor DT in the third direction (e.g., the Z-axis direction). The gate electrode DT_G may be disposed on the active layer DT_ACT of the driving transistor DT.

The gate electrode DT_G may be connected to a first connection electrode BE1 through a first contact hole CNT1. The first connection electrode BE1 may be connected to a second electrode D1-1 of a first-first transistor ST1-1 through a second contact hole CNT2. Because the first connection electrode BE1 extends in the second direction (e.g., the Y-axis direction), the first connection electrode BE1 may cross the kth scan line Sk.

The first electrode DT_S of the driving transistor DT may be connected to a first electrode S2 of the second transistor ST2. The second electrode DT_D of the driving transistor DT may be connected to a first electrode S1-2 of a first-second transistor ST1-2 and a first electrode S6 of the sixth transistor ST6.

The first transistor ST1 may be formed as a dual transistor. The first transistor ST1 may include the first-first transistor ST1-1 and the first-second transistor ST1-2.

The first-first transistor ST1-1 may include an active layer ACT1-1, a gate electrode G1-1, a first electrode S1-1, and a second electrode D1-1. The gate electrode G1-1 of the first-first transistor ST1-1 may be a part of the k−1th scan line Sk−1, and may correspond to (e.g., may be) an overlapping region of the active layer ACT1-1 of the first-first transistor ST1-1 and the k−1th scan line Sk−1. The first electrode S1-1 of the first-first transistor ST1-1 may be connected to the first connection electrode BE1 of the driving transistor DT through the second contact hole CNT2. The second electrode D1-1 of the first-first transistor ST1-1 may be connected to a first electrode S1-2 of the first-second transistor ST1-2.

The first-second transistor ST1-2 may include an active layer ACT1-2, a gate electrode G1-2, a first electrode S1-2, and a second electrode D1-2. The gate electrode G1-2 of the first-second transistor ST1-2 may be a part of the k−1th scan line Sk−1, and may correspond to (e.g., may be) an overlapping region of the active layer ACT1-2 of the first-second transistor ST1-2 and the k−1th scan line Sk−1. The first electrode S1-2 of the first-second transistor ST1-2 may be connected to the second electrode D1-1 of the first-first transistor ST1-1. The second electrode D1-2 of the first-second transistor ST1-2 may be connected to an initialization connection electrode VIE through a fourth contact hole CNT4.

The second transistor ST2 may include an active layer ACT2, a gate electrode G2, a first electrode S2, and a second electrode D2. The gate electrode G2 of the second transistor ST2 may be a part of the kth scan line Sk (where k is a positive integer of 2 or more), and may correspond to (e.g., may be) an overlapping region of the active layer ACT2 of the second transistor ST2 and the kth scan line Sk. The first electrode S2 of the second transistor ST2 may be connected to the first electrode DT_S of the driving transistor DT. The second electrode D2 of the second transistor ST2 may be connected to the jth data line Dj through a third contact hole CNT3.

The third transistor ST3 may be formed as a dual transistor. The third transistor ST3 may include a third-first transistor ST3-1 and a third-second transistor ST3-2.

The third-first transistor ST3-1 may include an active layer ACT3-1, a gate electrode G3-1, a first electrode S3-1, and a second electrode D3-1. The gate electrode G3-1 of the third-first transistor ST3-1 may be a part of the kth scan line Sk, and may correspond to (e.g., may be) an overlapping region of the active layer ACT3-1 of the third-first transistor ST3-1 and the kth scan line Sk. The first electrode S3-1 of the third-first transistor ST3-1 may be connected to the second electrode S3-2 of the third-second transistor ST3-2. The second electrode D3-1 of the third-first transistor ST3-1 may be connected to the first connection electrode BD through the second contact hole CNT2.

The third-second transistor ST3-2 may include an active layer ACT3-2, a gate electrode G3-2, a first electrode S3-2, and a second electrode D3-2. The gate electrode G3-2 of the third-second transistor ST3-2 may be a part of the kth scan line Sk, and may correspond to (e.g., may be) an overlapping region of the active layer ACT3-2 of the third-second transistor ST3-2 and the kth scan line Sk. The first electrode S3-2 of the third-second transistor ST3-2 may be connected to the second electrode DT_D of the driving transistor DT. The second electrode D3-2 of the third-second transistor ST3-2 may be connected to the first electrode S3-1 of the third-first transistor ST3-1.

The fourth transistor ST4 may include an active layer ACT4, a gate electrode G4, a first electrode S4, and a second electrode D4. The gate electrode G4 of the fourth transistor ST4 may be a part of the kth scan line Sk, and may correspond to (e.g., may be) an overlapping region of the active layer ACT4 of the fourth transistor ST4 and the kth scan line Sk. The first electrode S4 of the fourth transistor ST4 may be connected to an anode connection electrode ANDE through a sixth contact hole CNT6. The anode electrode AND of the light emitting element may be connected to the anode connection electrode ANDE through an anode contact hole AND_CNT. The second electrode D4 of the fourth transistor ST4 may be connected to the initialization connection electrode VIE through the fourth contact hole CNT4. The initialization voltage line VIL may be connected to the initialization connection electrode VIE through the fifth contact hole CNT5, and the initialization connection electrode VIE may be connected to the second electrode D1-2 of the first-second transistor ST1-2 and the second electrode D4 of the fourth transistor ST4 through the fourth contact hole CNT4. The initialization connection electrode VIE may be disposed to cross the k-th scan line Sk.

The fifth transistor ST5 may include an active layer ACT5, a gate electrode G5, a first electrode S5, and a second electrode D5. The gate electrode G5 of the fifth transistor ST5 may be a part of the kth light emitting line Ek, and may correspond to (e.g., may be) an overlapping region of the active layer ACT5 of the fifth transistor ST5 and kth light emitting line Ek. The first electrode S5 of the fifth transistor ST5 may be connected to a first-second driving voltage line VDDL2 through a seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6 may be a part of the kth light emitting line Ek, and may correspond to (e.g., may be) an overlapping region of the active layer ACT6 of the sixth transistor ST6 and kth light emitting line Ek. The first electrode S6 of the sixth transistor ST6 may be connected to the second electrode DT_D of the driving transistor DT. The second electrode D6 of the sixth transistor ST6 may be connected to the anode electrode AND of the light emitting element through the sixth contact hole CNT6.

A first electrode CE11 of the capacitor C1 may be a part of the gate electrode DT_G of the driving transistor DT, and the second electrode CE12 of the capacitor C1 may be a first-first driving voltage line VDDL1 overlapping with the second electrode DT_D of the driving transistor DT.

The first driving voltage line VDDL may include the first-first driving voltage line VDDL1 and the first-second driving voltage line VDDL2. The first-first driving voltage line VDDL1 may be connected to the first-second driving voltage line VDDL2 through the eighth contact hole CNT8. The first-second driving voltage line VDDL2 may be disposed in parallel with the jth data line Dj, and the first-first driving voltage line VDDL1 may be disposed in parallel with the kth scan line Sk.

Figure 19:
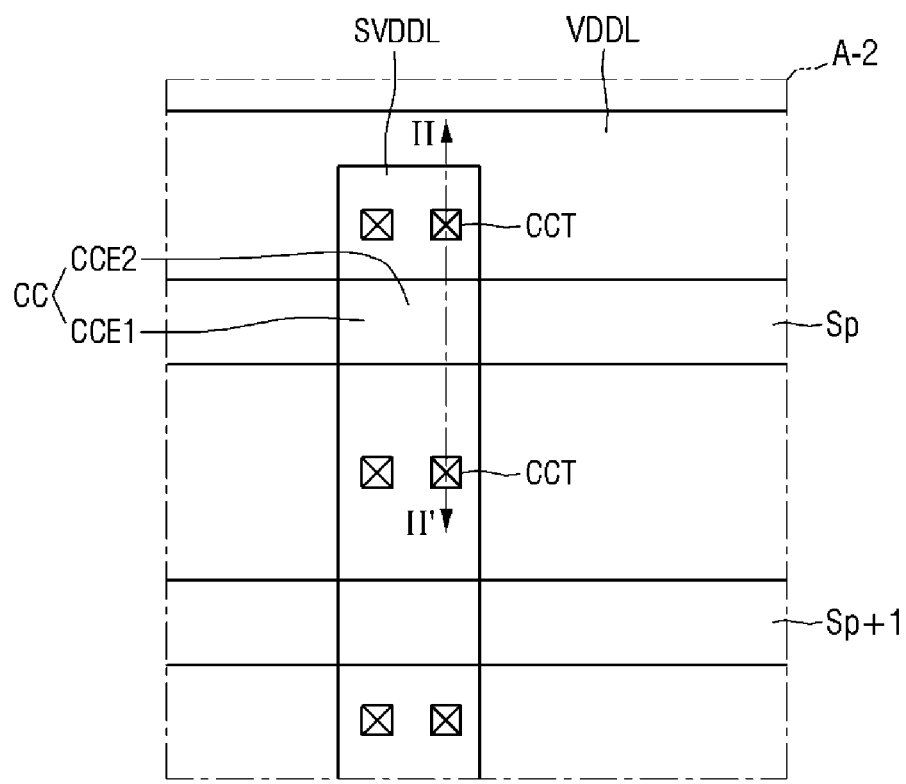
FIG. 19 is an enlarged plan view illustrating an example of the area A-2 of FIG. 15.

FIG. 19 is an enlarged plan view illustrating an example of the area A-2 of FIG. 15.

FIG. 19 illustrates compensation capacitors CC connected to the pth scan line Sp and the (p+1)th scan line Sp+1.

Referring to FIG. 19, the pth scan line Sp and the (p+1)th scan line Sp+1 may extend in the first direction (e.g., the X-axis direction). The sub-driving voltage line SVDDL may extend in the second direction (e.g., the Y-axis direction). The sub-driving voltage line SVDDL may cross the pth scan line Sp and the (p+1)th scan line Sp+1.

The first driving voltage line VDDL may overlap with the sub-driving voltage line SVDDL in the third direction (e.g., the Z-axis direction). The first driving voltage line VDDL may be connected to the sub-driving voltage line SVDDL through the connection contact holes CCT. The connection contact holes CCT may not overlap with the scan lines Sp and Sp+1 in the third direction (e.g., the Z-axis direction).

Each of the compensation capacitors CC may include a first electrode CCE1 and a second electrode CCE2. The first electrode CCE1 of the compensation capacitor CC may be a part of any suitable one of the scan lines Sp to Sp+5 overlapping with the sub-driving voltage line SVDDL in the third direction (e.g., the Z-axis direction). The second electrode CCE2 of the compensation capacitor CC may be a part of the sub-driving voltage line SVDDL overlapping with any suitable one of the scan lines Sp to Sp+5 in the third direction (e.g., the Z-axis direction).

Figure 20:
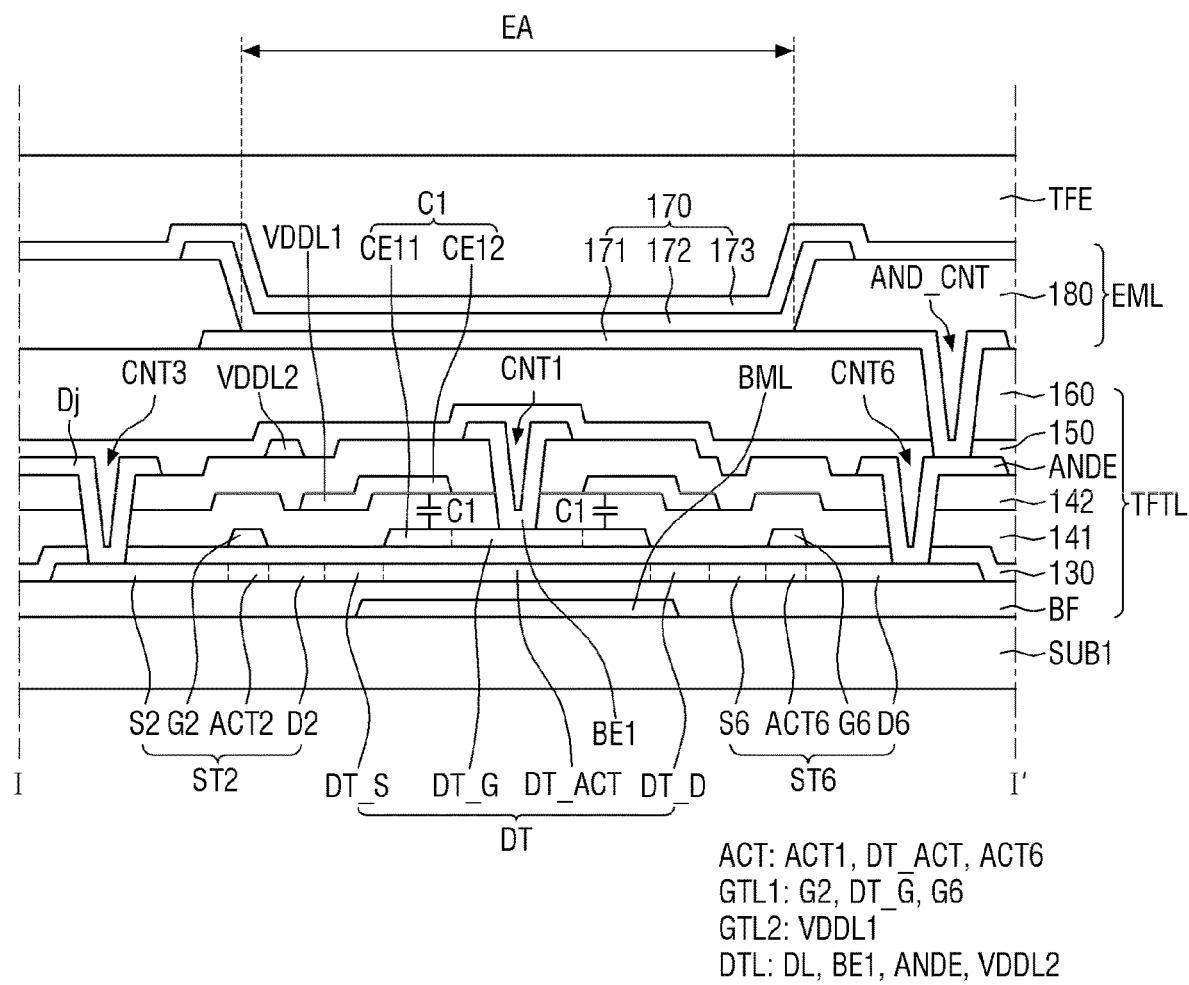
FIG. 20 is a cross-sectional view taken along the line I-I' of FIG. 18.
Figure 21:
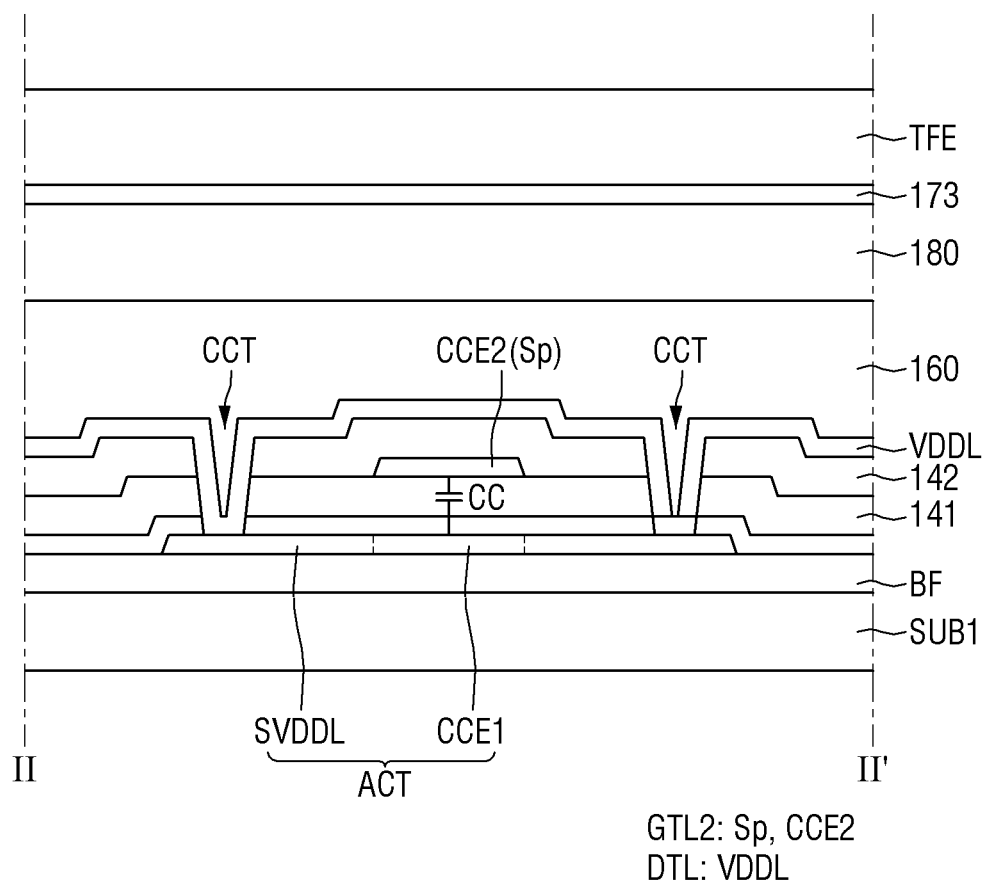
FIG. 21 is a cross-sectional view taken along the line II-II' of FIG. 19.

FIG. 20 is a cross-sectional view taken along the line I-I' of FIG. 18, and FIG. 21 is a cross-sectional view taken along the line II-II' of FIG. 19.

Referring to FIGS. 20 and 21, a thin film transistor layer TFTL, a light emitting element layer EML, and an encapsulation layer TFE may be sequentially formed on a substrate SUB1.

The thin film transistor layer TFTL includes a light blocking layer BML, a buffer film BF, an active layer ACT, a first gate layer GTL1, a second gate layer GTL2, a data metal layer DTL, a gate insulating film 130, a first interlayer insulating film 141, a second interlayer insulating film 142, a protective film 150, and a first organic film 160.

The light blocking layer BML may be formed on one surface (e.g., an upper surface or a top surface) of the substrate SUB1. In an embodiment, the light blocking layer BML may overlap with the active layer DT_ACT of the driving transistor DT in the third direction (e.g., the Z-axis direction) in order to block light incident on the active layer DT_ACT of the driving transistor DT, but the present invention is not limited thereto. For example, in another embodiment, the light blocking layer BML may overlap with the active layer DT_ACT of the driving transistor DT and the active layers ACT1 to ACT6 of the first to sixth transistors ST1 to ST6 in the third direction (e.g., the Z-axis direction) in order to block light incident on the active layer DT_ACT of the driving transistor DT as well as the active layers ACT1 to ACT6 of the first to sixth transistors ST1 to ST6. The third direction (e.g., the Z-axis direction) may be a thickness direction of the substrate SUB1. The light blocking layer BML may be formed to have a single-layer structure or a multi-layered structure including, for example, any suitable one or more of molybdenum (Mo), aluminum (Al), chromium (Cr), gold (Au), titanium (Ti), nickel (Ni), neodymium (Nd), and copper (Cu), and/or an alloy thereof.

The buffer film BF may be formed on the light blocking layer BML. The buffer film BF may be formed on one surface (e.g., an upper surface or a top surface) of the substrate SUB1 to protect the thin film transistors of the thin film transistor layer TFTL and an organic light emitting layer 172 of the light emitting element layer EML from moisture that may penetrate through the substrate SUB1, which may be vulnerable to moisture permeation. In an embodiment, the buffer film BF may be formed of a plurality of inorganic films that are alternately laminated. For example, the buffer film BF may be formed as a multi-layered film in which two or more inorganic layers selected from among a silicon nitride layer, a silicon oxynitride layer, a silicon oxide layer, a titanium oxide layer, and an aluminum oxide layer are alternately laminated, for example. However, the present disclosure is not limited thereto, and the buffer film BF may be omitted.

The active layer ACT may be formed on the substrate SUB1 or on the buffer film BF. The active layer ACT may include polycrystalline silicon, monocrystalline silicon, low-temperature polycrystalline silicon, amorphous silicon, or an oxide semiconductor. When the active layer ACT includes polycrystalline silicon or an oxide semiconductor, an ion-doped active layer ACT may have conductivity. Thus, the active layer ACT may include the active layer DT_ACT of the driving transistor DT, and the active layers ACT1 to ACT6 of the first to sixth switching transistors ST1 to ST6, as well as source electrodes DT_S, S1-1, S1-2, S2, S3-1, S3-2, S4, S5, and S6, and drain electrodes DT_D, D1-1, D1-2, D2, D3-1, D3-2, D4, D5, and D6. Further, as shown in FIG. 21, the active layer ACT may include the sub-driving voltage line SVDDL and the first electrode CCE1 of the compensation capacitor CC disposed at (e.g., in or on) the notch non-display area NNDA.

The gate insulating film 130 may be formed on the active layer ACT. The gate insulating film may be formed of an inorganic layer, for example, such as a silicon nitride layer, a silicon oxynitride layer, a silicon oxide layer, a titanium oxide layer, or an aluminum oxide layer.

The first gate layer GTL1 may be formed on the gate insulating film 130. The first gate layer GTL1 may include the gate electrode DT_G of the driving transistor DT, and the gate electrodes G1 to G6 of the first to sixth switching transistors ST1 to ST6, as well as the scan lines Sk−1 and Sk, and the light emitting line Ek. The first gate layer GTL1 may be formed to have a single-layer structure or a multi-layered structure including any suitable one or more of molybdenum (Mo), aluminum (Al), chromium (Cr), gold (Au), titanium (Ti), nickel (Ni), neodymium (Nd), and copper (Cu), and/or an alloy thereof.

The first interlayer insulating film 141 may be formed on the first gate layer GTL1. The first interlayer insulating film 141 may be formed of an inorganic layer, for example, such as a silicon nitride layer, a silicon oxynitride layer, a silicon oxide layer, a titanium oxide layer, or an aluminum oxide layer. For example, in an embodiment, the first interlayer insulating film 141 may include a plurality of inorganic layers.

The second gate layer GTL2 may be formed on the first interlayer insulating film 141. The second gate layer GTL2 may include an initialization voltage line VIL and a first-first driving voltage line VDDL1. Further, as shown in FIG. 21, the second gate layer GTL2 may include the scan line Sp and the second electrode CCE2 of the compensation capacitor CC disposed at (e.g., in or on) the notch non-display area NNDA. The second gate layer GTL2 may be formed to have a single-layer structure or a multi-layered structure including, for example, any suitable one or more of molybdenum (Mo), aluminum (Al), chromium (Cr), gold (Au), titanium (Ti), nickel (Ni), neodymium (Nd), and copper (Cu), and/or an alloy thereof.

The second interlayer insulating film 142 may be formed on the second gate layer GTL2. The second interlayer insulating film 142 may be formed of an inorganic layer, for example, such as a silicon nitride layer, a silicon oxynitride layer, a silicon oxide layer, a titanium oxide layer, or an aluminum oxide layer. For example, in an embodiment, the second interlayer insulating film 142 may include a plurality of inorganic layers.

The data metal layer DTL may be formed on the second interlayer insulating film 142. The data metal layer DTL may include data lines DL, a first-second driving voltage line VDDL2, a first connection electrode BE1, an anode connection electrode ANDE, and an initialization connection electrode VIE. Further, as shown in FIG. 21, the data metal layer DTL may include the first driving voltage line VDDL disposed at (e.g., in or on) the display notch area DTA. The data metal layer DTL may be formed to have a single-layer structure or a multi-layered structure including any suitable one or more of molybdenum (Mo), aluminum (Al), chromium (Cr), gold (Au), titanium (Ti), nickel (Ni), neodymium (Nd), and copper (Cu), and/or an alloy thereof.

The first organic layer 160 may be formed on the data metal layer DTL to planarize or substantially planarize a step caused by the active layer ACT, the first gate layer GTL1, the second gate layer GTL2, and the data metal layer DTL. The first organic layer 160 may be formed of, for example, an acrylic resin, an epoxy resin, a phenolic resin, a polyamide resin, or a polyimide resin.

The protective film 150 may be additionally formed between the data metal layer DTL and the first organic layer 160. The protective film 150 may be formed of an inorganic layer, for example, such as a silicon nitride layer, a silicon oxynitride layer, a silicon oxide layer, a titanium oxide layer, or an aluminum oxide layer.

Although FIG. 8 illustrates that the driving transistor DT and the first to sixth transistors ST1 to ST6 are formed in a top gate manner in which the gate electrode is located over the active layer, the present invention is not limited thereto. In other words, in another embodiment, the driving transistor DT and the first to sixth transistors ST1 to ST6 may be formed in a bottom gate manner in which the gate electrode is located under (e.g., underneath) the active layer, or in a double gate manner in which the gate electrode is located both over and under (e.g., underneath) the active layer.

The first contact hole CNT1 may be a hole that penetrates (e.g., that extends) through the first interlayer insulating film 141 and the second interlayer insulating film 142 to expose the gate electrode DT_G of the driving transistor DT. The first connection electrode BE1 may be connected to the gate electrode DT_G of the driving transistor DT through the first contact hole CNT1.

The second contact hole CNT2 may be a hole that penetrates (e.g., that extends) through the gate insulating film 130, the first interlayer insulating film 141, and the second interlayer insulating film 142 to expose the second electrode D3-1 of the third-first transistor ST3-1. The first connection electrode BE1 may be connected to the second electrode D3-1 of the third-first transistor ST3-1 through the second contact hole CNT2.

The third contact hole CNT3 may be a hole that penetrates (e.g., that extends) through the gate insulating film 130, the first interlayer insulating film 141, and the second interlayer insulating film 142 to expose the first electrode S2 of the second transistor ST2. The data line DL (e.g., the jth data line Dj) may be connected to the first electrode S2 of the second transistor ST2 through the third contact hole CNT3.

The fourth contact hole CNT4 may be a hole that penetrates (e.g., that extends) through the gate insulating film 130, the first interlayer insulating film 141, and the second interlayer insulating film 142 to expose the second electrode D1 of the first transistor ST1 and the second electrode D4 of the fourth transistor ST4. The initialization connection electrode VIE may be connected to the first-second electrode D1-2 of the first-second transistor ST1-2 and the second electrode D4 of the fourth transistor ST4 through the fourth contact hole CNT4.

The fifth contact hole CNT5 may be a hole that penetrates (e.g., that extends) through the second interlayer insulating film 142 to expose the initialization voltage line VIL. The initialization connection electrode VIE may be connected to the initialization voltage line VIL through the fifth contact hole CNT5.

The sixth contact hole CNT6 may be a hole that penetrates (e.g., that extends) through the gate insulating film 130, the first interlayer insulating film 141, and the second interlayer insulating film 142 to expose the second electrode D6 of the sixth transistor ST6. The anode connection electrode ANDE may be connected to the second electrode D6 of the sixth transistor ST6 through the sixth contact hole CNT6.

The seventh contact hole CNT7 may be a hole that penetrates (e.g., that extends) through the gate insulating film 130, the first interlayer insulating film 141, and the second interlayer insulating film 142 to expose the first electrode S5 of the fifth transistor ST5. The first-second driving voltage line VDDL2 may be connected to the first electrode S5 of the fifth transistor ST5 through the seventh contact hole CNT7.

The eighth contact hole CNT8 may be a hole that penetrates (e.g., that extends) through the second interlayer insulating film 142 to expose the first-first driving voltage line VDDL1. The first-second driving voltage line VDDL2 may be connected to the first-first driving voltage line VDDL1 through the eighth contact hole CNT8.

The anode contact hole AND_CNT may be a hole that penetrates (e.g., that extends) through the first protective film 150 and the first organic film 160 to expose the anode connection electrode ANDE.

The connection contact hole CCT may be a hole that penetrates through the gate insulating film 130, the first interlayer insulating film 141, and the second interlayer insulating film 142 to expose the sub-driving voltage line SVDDL.

The light emitting element layer EML is formed on the thin film transistor layer TFTL. The light emitting element layer EML includes light emitting elements 170, and a pixel defining film 180.

The light emitting elements 170 and the pixel defining film 180 are formed on the first organic film 160. Each of the light emitting elements 170 may include a first electrode 171, an organic light emitting layer 172, and a second electrode 173.

The first electrode 171 may be formed on the first organic film 160. The first electrode 171 may be connected to the anode connection electrode ANDE through the anode contact hole AND_CNT penetrating (e.g., extending) through the protective film 150 and the first organic film 160.

In the top emission structure in which light is emitted towards the second electrode 173 based on the organic light emitting layer 172, the first electrode 171 may be formed of a metal material having high reflectance, for example, such as a laminated structure of aluminum and titanium (e.g., Ti/Al/Ti), a laminated structure of aluminum and ITO (e.g., ITO/Al/ITO), an APC alloy, or a laminated structure of an APC alloy and ITO (e.g., ITO/APC/ITO). The APC alloy may be an alloy including (e.g., an alloy of) silver (Ag), palladium (Pd), and copper (Cu).

The pixel defining film 180 may be formed on a planarization film 160 to divide the first electrode 171 in order to define a light emitting area EA of each pixel PX (e.g., of each sub-pixel SP1, SP2, and SP3 shown in FIG. 10). The pixel defining film 180 may be formed to cover an edge (e.g., opposite edges) of the first electrode 171. The pixel defining film 180 may be formed as an organic film including, for example, an acrylic resin, an epoxy resin, a phenolic resin, a polyamide resin, or a polyimide resin.

The light emitting area EA of each of the sub-pixels SP1, SP2, and SP3 may be an area in which the first electrode 171, the organic light emitting layer 172, and the second electrode 173 are sequentially laminated. In this case, holes from the first electrode 171 and electrons from the second electrode 173 may be combined with each other in the organic light emitting layer 172 to emit light.

The organic light emitting layer 172 is formed on the first electrode 171 and the pixel defining film 180. The organic light emitting layer 172 includes an organic material to emit light of a desired or suitable color (e.g., a predetermined color). For example, the organic light emitting layer 172 may include a hole transporting layer, an organic material layer, and an electron transporting layer. In an embodiment, the organic light emitting layer 172 of the first sub-pixel SP1 may emit light of a first color, the organic light emitting layer 172 of the second sub-pixel SP2 may emit light of the second color, and the organic light emitting layer 172 of the third sub-pixel. SP3 may emit light of a third color. In another embodiment, the organic light emitting layers 172 of the sub-pixels SP1, SP2, and SP3 may emit white light, and in this case, the first sub-pixel SP1 may overlap with a color filter layer of the first color, the second sub-pixel SP2 may overlap with a color filter layer of the second color, and the third sub-pixel SP3 may overlap with a color filter layer of the third color. In an embodiment, the first color may be red, the second color may be green, and the third color may be blue, but the present invention is not limited thereto.

The second electrode 173 is formed on the organic light emitting layer 172. The second electrode 173 may be formed to cover the organic light emitting layer 172. The second electrode 173 may be a common layer that is commonly formed at (e.g., in or on) the sub-pixels SP1, SP2, and SP3. In an embodiment, a capping layer may be formed on the second electrode 173.

In the top emission structure, the second electrode 173 may be formed of a transparent conductive material (TCO), for example, such as ITO or IZO, which may transmit light, or may be formed of a semi-transmissive conductive material, for example, such as magnesium (Mg), silver (Ag), or an alloy of magnesium (Mg) and silver (Ag). When the second electrode 173 is formed of the semi-transmissive conductive material, light emission efficiency may be increased by microcavities.

The encapsulation layer TFE may be formed on the light emitting element layer EML. The encapsulation layer TFE may include at least one inorganic film to prevent or substantially prevent oxygen and/or moisture from penetrating into the light emitting element layer EML. Further, the encapsulation layer TFE may include at least one organic film to protect the light emitting element layer EML from foreign matter, for example, such as dust.

However, the present invention is not limited thereto, for example, in another embodiment, a second substrate, instead of the encapsulation layer TFE, may be disposed on the light emitting element layer EML. In this case, a space between the light emitting element layer EML and the second substrate may be empty in a vacuum state, or may be provided therein with a filling film.

As described above, a portion of the sub-driving voltage line SVDDL formed in the active layer ACT at (e.g., in or on) the notch non-display area NNDA may be formed as the first electrode CCE1 of the compensation capacitor CC, and a portion of the scan line Sp formed in the second gate layer GTL2 may be formed as the second electrode CCE2 of the compensation capacitor CC. Because the first electrode CCE1 and the second electrode CCE2 may overlap with each other in the third direction (e.g., the Z-axis direction), the compensation capacitor CC may be formed.

While FIGS. 19 and 21 illustrate that the second electrode CCE2 of the compensation capacitor CC is electrically connected to the first driving voltage line VDDL to which the first driving voltage is applied, the present invention is not limited thereto. For example, as shown in FIG. 18, the second electrode CCE2 of the compensation capacitor CC may be electrically connected to the initialization voltage line VIL to which the initialization voltage is applied.

According to one or more example embodiments of the present disclosure, a display area may include a first display area and a second display area protruding from one side of the first display area in one direction, and the capacitance of q scan lines in the second display area may increase in one direction. For example, the number of compensation capacitors connected to a scan line from scan lines arranged adjacent to each other in one direction of the second display area may increase, decrease, increase, and decrease. Thus, the load of q scan lines in one direction of the second display area may increase. Therefore, a difference between an RC delay of the scan line in the second display area adjacent to the first display area and an RC delay of the scan line in the first display area adjacent to the second display area may be reduced or minimized. Thus, a difference between a pulse width of the scan signal applied to the scan line in the second display area adjacent to the first display area and a pulse width of the scan signal applied to the scan line in the first display area adjacent to the second display area may be reduced or minimized. Accordingly, due to the pulse width of the scan signal, the occurrence of a difference between luminance of the pixels connected to the scan line in the second display area adjacent to the first display and luminance of the pixels connected to the scan line in the first display area adjacent to the second display area may be prevented or substantially prevented.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present invention as defined in the appended claims, and their equivalents.

What is claimed is:

1. A display device comprising:
    a substrate;
    scan lines extending in a first direction, and arranged along a second direction crossing the first direction on the substrate;
    data lines extending in the second direction, and arranged along the first direction on the substrate;
    a display area comprising pixels connected to the scan lines and the data lines;
    a non-display area around the display area, and comprising compensation capacitors connected to some scan lines from among the scan lines;
    a first driving voltage line connected to a second electrode of the compensation capacitor; and
    a sub-driving voltage line connected to a first electrode of a compensation capacitor from among the compensation capacitors, and connected to the first driving voltage line through a connection contact hole,
    wherein a sum of a capacitance of q odd scan lines or q even scan lines that are adjacent to each other from among the scan lines increases in the second direction, where q is a positive integer.

2. The display device of claim 1,
    wherein the sum of the capacitance of the q odd scan lines or the q even scan lines is defined as a sum of a capacitance of a pth scan line, a capacitance of a (p+2)th scan line, and capacitance of a (p+4)th scan line, where p is a positive integer.

3. The display device of claim 2,
    wherein the sum of the capacitance of the q odd scan lines or the q even scan lines increases as the p increases.

4. The display device of claim 2,
    wherein the sum of the capacitance of the pth scan line, the capacitance of the (p+2)th scan line, and the capacitance of the (p+4)th scan line is less than a sum of a capacitance of the (p+2)th scan line, the capacitance of the (p+4)th scan line, and a capacitance of a p+6th scan line.

5. The display device of claim 2,
    wherein a number of the compensation capacitors connected to the pth scan line is greater than a number of the compensation capacitors connected to a (p+1)th scan line.

6. The display device of claim 5,
    wherein the number of the compensation capacitors connected to the (p+1)th scan line is less than a number of the compensation capacitors connected to the (p+2)th scan line.

7. The display device of claim 1, wherein each of the compensation capacitors comprises:
    the first electrode connected to one of the scan lines; and
    a second electrode overlapping with the first electrode, and electrically connected to a first driving voltage line to which a first driving voltage is applied.

8. The display device of claim 7,
    wherein each of the pixels comprises a driving transistor comprising an active layer on a buffer film, and a first electrode, a second electrode, and a gate electrode on the active layer, and
    wherein the first electrode of the compensation capacitor is on the buffer film.

9. The display device of claim 8,
    wherein the second electrode of the compensation capacitor is on a first insulating film on the gate electrode.

10. The display device of claim 9,
    wherein the first driving voltage line is on a second insulating film on the second electrode of the compensation capacitor.

11. The display device of claim 10, wherein the sub-driving voltage line is on the buffer film,
    wherein the first driving voltage line is connected to the sub-driving voltage line through the connection contact hole penetrating the first insulating film and the second insulating film.

12. The display device of claim 1, wherein the display area comprises:
   a first display area;
   a second display area protruding from a first side of the first display area in the second direction; and
   a third display area protruding from the first side of the first display area in the second direction, the third display area being spaced from the second display area in the first direction,
   wherein the non-display area comprises a notch non-display area at a notch area between the second display area and the third display area in the first direction, and
   wherein the compensation capacitors are located at the notch non-display area.

13. The display device of claim 12,
   wherein scan lines of the second display area are electrically separated from scan lines of the third display area.

14. The display device of claim 13, further comprising:
   a first scan driver adjacent to the second display area and connected to the scan lines of the second display area; and
   a second scan driver adjacent to the third display area and connected to the scan lines of the third display area.

15. A display device comprising:
   a display area comprising scan lines extending in a first direction, data lines extending in a second direction crossing the first direction, and pixels connected to the scan lines and the data lines;
   a non-display area around the display area, and comprising compensation capacitors connected to some of the scan lines;
   a first driving voltage line connected to a second electrode of the compensation capacitor; and
   a sub-driving voltage line connected to a first electrode of a compensation capacitor from among the compensation compacitors, and connected to the first driving voltage line through a connection contact hole,
   wherein a number of the compensation capacitors connected to a pth scan line from among the scan lines is greater than a number of the compensation capacitors overlapping with a (p+1)th scan line from among the scan lines, where p is a positive integer.

16. The display device of claim 15,
   wherein the number of the compensation capacitors connected to the (p+1)th scan line is less than a number of the compensation capacitors connected to a (p+2)th scan line.

17. The display device of claim 15,
   wherein a capacitance of q odd scan lines or q even scan lines that are adjacent to each other from among the scan lines increases in the second direction, where q is a positive integer, and
   the capacitance of the q odd scan lines or the q even scan lines is defined as a sum of a capacitance of the pth scan line, a capacitance of a (p+2)th scan line, and a capacitance of a (p+4)th scan line.

18. A display device, comprising:
   a substrate;
   an active layer of a driving transistor and a first electrode of a compensation capacitor, the active layer and the first electrode being arranged on the substrate;
   a gate insulating film on the active layer of the driving transistor and the first electrode of the compensation capacitor; and
   a second electrode of the compensation capacitor on the gate insulating film, and overlapping with the first electrode of the compensation capacitor in a thickness direction of the substrate,
   wherein the active layer of the driving transistor and the first electrode of the compensation capacitor includes a same material.

19. The display device of claim 18, further comprising:
   a gate electrode of the driving transistor on the gate insulating film, and overlapping the active layer of the driving transistor in the thickness direction of the substrate;
   a first insulating film on the gate electrode;
   a second insulating film on the second electrode of the compensation capacitor; and
   a first driving voltage line on the second insulating film, the first driving voltage line configured to receive a first driving voltage.

20. The display device of claim 19,
   wherein the first driving voltage line is connected to the first electrode of the compensation capacitor through a connection contact hole penetrating the first insulating film and the second insulating film.

* * * * *